(12) United States Patent
Suzuki et al.

(10) Patent No.: US 7,484,999 B2
(45) Date of Patent: Feb. 3, 2009

(54) RELAY CONNECTOR

(75) Inventors: Hisashi Suzuki, Tokyo (JP); Ryoichi Hirako, Tokyo (JP)

(73) Assignee: Yokowo Co., Ltd., Tokyo (JP)

( * ) Notice: Subject to any disclaimer, the term of this patent is extended or adjusted under 35 U.S.C. 154(b) by 0 days.

(21) Appl. No.: 12/000,143

(22) Filed: Dec. 10, 2007

(65) Prior Publication Data

US 2008/0139009 A1  Jun. 12, 2008

(30) Foreign Application Priority Data

Dec. 11, 2006 (JP) ............................ P2006-333086
Nov. 5, 2007 (JP) ............................ P2007-286924

(51) Int. Cl.
*H01R 9/05* (2006.01)
(52) U.S. Cl. ........................................ 439/581; 439/63
(58) Field of Classification Search ................ 439/581, 439/578, 579, 63
See application file for complete search history.

(56) References Cited

U.S. PATENT DOCUMENTS

| 5,017,865 | A |   | 5/1991  | Oldfield              |
|-----------|---|---|---------|-----------------------|
| 5,670,744 | A | * | 9/1997  | Ritchey ........ 174/51 |
| 5,763,830 | A | * | 6/1998  | Hsueh ........... 174/60 |
| 5,909,063 | A | * | 6/1999  | Silliman et al. ...... 307/112 |
| 5,997,314 | A | * | 12/1999 | Wallace et al. ....... 439/63 |
| 6,007,347 | A | * | 12/1999 | Keldsen et al. ....... 439/63 |

* cited by examiner

*Primary Examiner*—Hien Vu
(74) *Attorney, Agent, or Firm*—Morgan, Lewis & Bockius LLP

(57) ABSTRACT

A conductive main block is formed with a through hole in which a dielectric member of a coaxial connector is inserted. A shell GND of the coaxial connector is secured on a surface of the main block. The core conductor peeled from the dielectric member is projected from an opposite surface of the main block. A conductive GND block includes a board receiving portion on which an end of the board is placed. The GND block can move relatively to the main block, by a guide member, in a linear direction parallel to the surface from which the core conductor is projected. By the relative movement of the main block and the GND block, the core conductor and the board receiving portion are caused to approach or be separated from each other so that the board can be inserted and sandwiched therebetween.

16 Claims, 21 Drawing Sheets

RELAY CONNECTOR

BACKGROUND OF THE INVENTION

The invention relates to a relay connector for board inspection and others for electrically connecting a core conductor of a coaxial connector to a terminal electrode formed on the front surface of a board and also electrically connecting a shell GND of the coaxial connector to a GND electrode formed on the back surface of the board.

In design/manufacture of a high frequency circuit board, on the way of designing, characteristic evaluation must be done. In this case, by electrically connecting a core conductor of a coaxial connector to a terminal electrode formed at the end on the front surface of a board and also electrically connecting a shell GND of the coaxial connector to a GND electrode formed at the end on the back surface of the board, the characteristic evaluation is done on the basis of the high frequency signal produced from the terminal electrode. Referring to FIGS. 25 and 26, a brief explanation will be given of a related art structure of electrically connecting a coaxial connector to a board. FIG. 25 is a view showing a related art structure of electrically connecting the coaxial connector to the board. FIG. 26 is an exploded perspective view of a related art structure before the coaxial connector is connected to the board. In FIGS. 25 and 26, by soldering, core conductors 14*a* of coaxial connectors 14 (for example, SMA type connectors) are electrically connected to terminal electrodes 12 formed at the end of the front surface of a board 10, whereas by soldering, shell GNDs 14*b* of the coaxial connectors 14 are electrically connected to the GND electrode 16 formed at the end of the back surface of the board 10.

In the related art structure shown in FIGS. 25 and 26, the soldering operation when electrically connecting the coaxial connectors 14 to the board 10 is complicated. The operation of melting the solder when removing the coaxial connectors 14 is also complicated. In addition, in the soldering and solder-melting, heat may be conducted to the dielectric member of resin which is a component of the coaxial connector, which results in a fear of deformation and electrically characteristic change in the dielectric member. This limits the number of times of repetitive use, and so is not economical.

In order to obviate such an inconvenience, the related art for electrically connecting the coaxial connector to the board is disclosed in U.S. Pat. No. 5,017,865. This art is, in brief, to fix the shell GND of the coaxial connector to a block of a conductive material, make the core conductor of the coaxial connector project from the one surface of the block in an electrically insulated state, and provide a moving member formed of the conductive material movable along the one surface of the block. With the board being loaded on the moving member, the moving member is moved toward the core conductor so that the terminal electrode formed at the end of the surface of the board is brought into contact with the core conductor, thereby making an electric connection therebetween. Further, since the GND electrode formed at the end of the back surface of the board is loaded on the moving member, it is electrically connected to the shell GND through the moving member and the block. Thus, the coaxial connector can be electrically connected to the board without the soldering.

In the related art disclosed in U.S. Pat. No. 5,017,865, the structure for moving the moving member with the board being load toward the core conductor of the coaxial connector is complicated and so the entire device is fairly bulky. It is preferable that the device is smaller in size and can provide easier attachment/detachment of the coaxial connector for the board.

SUMMARY

It is therefore an object of the invention to provide a relay connector which is small in size and can electrically connect a coaxial connector to a board by a simple operation and easily remove the coaxial connector from the board.

In order to achieve the object, according to the invention, there is provided a relay connector for electrically connecting a core conductor of a coaxial connector to a terminal electrode provided on a front surface end of a board and for electrically connecting a shell GND of the coaxial connector to a GND electrode provided on a back surface end of the board, the relay connector comprising;

a main block, comprised of a conductive material, and formed with a through hole in which a dielectric member of the coaxial connector is inserted, wherein the shell GND of the coaxial connector is secured on a surface of the main block and the core conductor peeled from the dielectric member is projected from an opposite surface of the main block, and a GND block, comprised of a conductive material, and including a board receiving portion on which an end of the board is placed, wherein the GND block can move relatively to the main block, by a guide member, in a linear direction parallel to the surface from which the core conductor is projected, wherein:

by the relative movement of the main block and the GND block, the core conductor and the board receiving portion are caused to approach or be separated from each other so that the board can be inserted and sandwiched therebetween;

an insulating cover in contact with the core conductor is arranged on the surface from which the core conductor is projected on a side opposite to the board receiving portion in an approaching and separating direction; and the main block and the GND block are electrically connected to each other.

The main block and the GND block may be elastically urged between the core conductor and the board receiving portion in a direction of approaching each other by an elastic member so that the board is sandwiched between the core conductor and the board receiving portion by elastic force of the elastic member.

A movement limiting unit may be provided to limit the relative movement of the main block and the GND block in a state where the board is sandwiched between the core conductor and the board receiving portion.

A leaf spring comprised of a conductive material may be secured to the GND block. The leaf spring may be brought into an elastic contact with the main block sliding in the approaching and separating direction so that the GND block is electrically connected to the main block.

The guide member may include a guide pin formed with one of the main block and the GND block and formed upright in the approaching and separating direction, and a guide hole formed with the other of the main block and the GND block and into which the guide pin is inserted.

The guide member may include a guide through hole formed with one of the main block and the GND block and extending in the approaching and separating direction, and a guide screw passing through the guide through hole from the other of the main block and the GND block so that a tip portion thereof is screwed on the one of the main block and the GND block.

An operating member may be arranged above the main block on a side opposite to the board receiving portion with respect to the core conductor. An elastic member may be arranged in a compressed manner between the operating member and the main block to elastically urge the operating member in a direction of being separated from the main block. A coupling member may couple the operating member with the GND block. When the operating member is pressed and moved against elastic force of the elastic member, the board receiving portion may move in a direction of being separated from the core conductor. The board may be inserted in a gap between the core conductor and the board receiving portion extended by pressing the operating member against the elastic force of the elastic member. By releasing pressing of the operating member, the board may be sandwiched between the core conductor and the board receiving portion by the elastic force of the elastic member.

An elastic member may be arranged in a compressed manner between the main block and the GND block to elastically urge the main block and the GND block in directions of being separated from each other thereby to extend a gap between the core conductor and the board receiving portion by elastic force of the elastic member so that the board can be inserted in the gap. The main block and the GND block may be relatively moved against the elastic force of the elastic member in directions of approaching each other so that the board is sandwiched between the core conductor and the board receiving portion.

An elastic member may be hung between the main block and the GND block to elastically urge the main block and the GND block in directions of approaching each other. The main block and the GND block may be moved in directions of being separated from each other against elastic force of the elastic member thereby to extend a gap between the core conductor and the board receiving portion and the board is inserted in the gap. Force in the directions in which the main block and the GND block are separated from each other is released. The board may be sandwiched between the core conductor and the board receiving portion by the elastic force of the elastic member.

A tip portion of the core conductor may be projected in an axial direction from the insulating cover.

A width of the relay connector may be equal to that of the coaxial connector.

A groove opposed to the core conductor and having a width nearly equal to an outer shape of the core conductor may be formed in the board receiving portion of the GND block.

A guide portion may be provided at the GND block so as to project toward a side more forward than a projecting tip portion of the core conductor, from which the board is to be inserted. A slope may be provided at the guide portion so as to continue to the board receiving portion, and a side of the slope, from which the board is to be inserted, may be receded from a height of the projecting core conductor in a direction of the relative movement.

The guide portion may be formed in a shape of an isosceles triangle with an apex angle of 90 degrees when viewed from a side of the core conductor in the direction of the relative movement.

A holding lever may be swingably arranged on a side opposite to the main block with respect to the operating member by a frame arranged in the main block. At a first swinging position of the holding lever, the operating member may be pressed and moved toward the main block against the elastic force of the elastic member to fall in a pressed state. At a second swinging position of the holding lever, pressing of the operating member may be released so that the operating member falls in a released state.

A plurality of the relay connectors may be fixed to a single bed so that a side of a single board can be inserted between the board receiving portions of the relay connectors and the core conductors of the coaxial connectors. The core conductors of the coaxial connectors may face a plurality of terminal electrodes provided at a surface end of the side of the board inserted.

According to the invention, there is also provided a relay connector, comprising:

a conductive first block, including: a first surface; a second surface, being opposite to the first surface; and a through hole which communicates the first surface and the second surface and extends in a first direction and into which a coaxial connector is inserted so that a core conductor of the coaxial connector is projected from the first surface and a shell GND of the coaxial connector is secured on the second surface, and a conductive second block, including a third surface on which a board both surfaces of which are formed with a first terminal and a second terminal, respectively, is to be put, wherein the first block and the second block are electrically connected with each other, the first block and the second block are adapted to be moved relatively to each other in a second direction parallel to the first surface and perpendicular to the first direction so that a size of a space between the core conductor projected from the first surface of the first block and the third surface of the second block in the second direction is changed, the board can be arranged in the space so that the first terminal is brought in contact with the core conductor of the coaxial terminal and the second terminal is brought in contact with the third surface of the second block.

BRIEF DESCRIPTION OF THE DRAWINGS

FIG. 1A is a front view, FIG. 1B is a plan view and FIG. 1C is a left side view.

FIG. 5A is a front view, FIG. 5B is a plan view and FIG. 5C is a left side view.

FIG. 9A is a front view, FIG. 9B is a plan view and FIG. 9C is a left side view.

FIG. 13A is a front view, FIG. 13B is a plan view, FIG. 13C is a left side view and FIG. 13D is a right side view.

FIG. 17A is a front view, FIG. 17B is a plan view and FIG. 17C is a left side view.

FIG. 18A shows the deformation of the board in the fifth embodiment and FIG. 18B shows the deformation of the board in the first embodiment.

FIG. 19A shows the high frequency loss characteristic in the fifth embodiment and FIG. 19B shows the high frequency loss characteristic in the first embodiment.

DETAILED DESCRIPTION OF PREFERRED EMBODIMENTS

Figure 25:
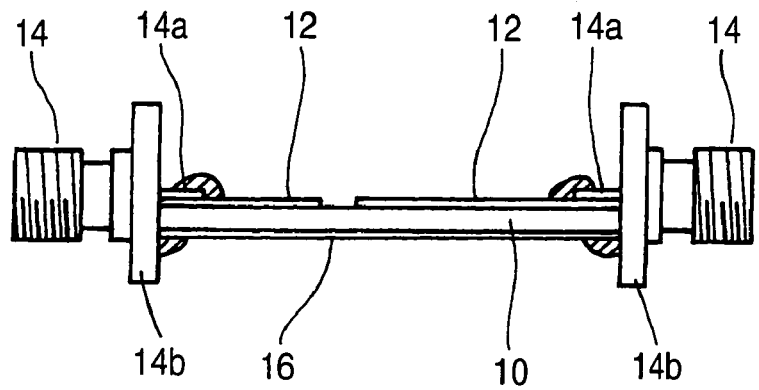
FIG. 25 is a view showing a related art structure of electrically connecting a coaxial connector to a board.
Figure 26:
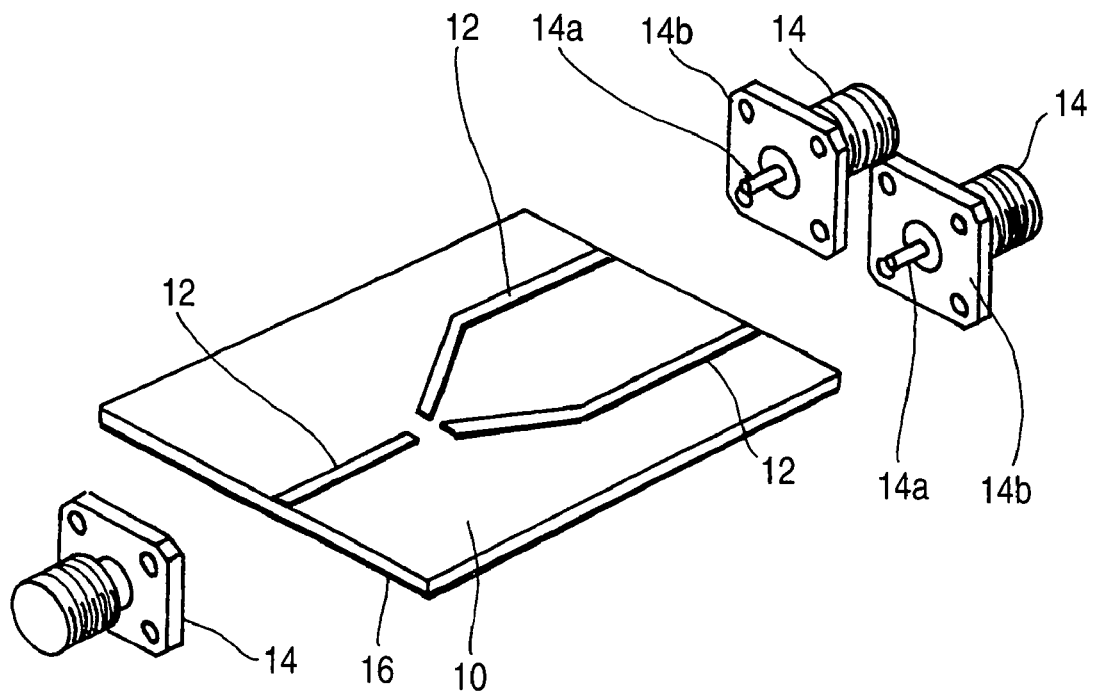
FIG. 26 is an exploded perspective view of a related art structure before a coaxial connector is connected to a board.

Now referring to FIGS. 1 to 4, the first embodiment of the invention will be explained below. In FIGS. 1 to 4, in order to avoid repetitive explanation, like or equivalent members refer to like reference symbols in FIGS. 25 and 26.

Referring to FIGS. 1 to 4, in the first embodiment of the relay connector according to the invention, a through-hole 20a is made in a main block 20 of a conductive material; a dielectric member 22b projected from a shell ground (GND) 22a of a coaxial connector (for example, SMA type connector) 22 is inserted into the through-hole 20a from the back surface; the shell GND 22a is fixed to the back surface by a screw; and a core conductor 22c peeled from the dielectric member 22b on the front surface of the main block 20 is projected. Now, the end surface of the dielectric member 22b is nearly flush with or slightly retracted from the front surface of the main block 20. Further, the axial direction in which the core conductor 22c projects is perpendicular to the front surface of the main block 20. The main block 20 has guide pins 24 formed upright in parallel to the front surface. A GND block 26 of a conductive material have guide holes 26a into which the guide pins 24, 24 are inserted. By detachably inserting the guide pins 24, 24 into these guide holes 26a, 26a, the GND block 26 can be moved relatively to the main block 20 in a linear direction in parallel to the front surface of the main block 20. Further, the GND block 26 has a board receiving portion 26b to face the core conductor 22c so that the board receiving portion 26b can move for the core conductor 22c in an approaching/separating direction by relative movement. Now, the guide pins 24 and guide holes 26a, 26a constitute a guide member. Further, on the front surface of the main block 20, an insulating cover 28 is secured in contact with the core conductor 22c by screws on the side opposite to the board receiving portion 26b in the approaching/separating direction. The insulating cover 28 has a shallow É shape with the side of the board receiving portion 26b being extended when the core conductor 22c is viewed from the tip end side in the axial direction, in which only a portion opposite to the board receiving portion being in contact with the core conductor 22c. Further, the tip of the core conductor 22c is set to project slightly from the insulating cover 28 in the axial direction.

Further, moving range limiting screws 32 are passed through moving range limiting through-holes 30a made to penetrate an operating member 30 so that they are movable in a predetermined range in the axial direction. Their tips are screwed on the side of the main block 20 opposite to the side on which the GND block 26 is arranged. The operating member 30 is arranged so that it can move relatively to the main block 20 in a predetermined rage in the approaching/separating direction. Now, the approaching/separating direction of the GND block 26 for the core conductor 22c is nearly parallel to that of the operating member 30 for the main block 20. In addition, elastic springs 34 are arranged in a compressed manner between the operating member 30 and the main block 20 so that the operating member is elastically urged in the direction of being separated from the main block 20. Further, the operating member 30 and the GND block 26 are coupled with each other through coupling members 38 by coupling pins 36. When the operating member 30 moves in the approaching/separating direction, the coupling members 38 may move the GND block 26 in the approaching/separating direction. Further, a conductive leaf spring 40 secured to the GND block 26 by screws is arranged so that it slidably comes in an elastic contact with the main block 20 which relatively moves in the approaching/separating direction. The lateral width W of the relay connector according to the first embodiment is set to be equal to that of the coaxial connector 22, e.g. 12.7 mm.

Figure 4:
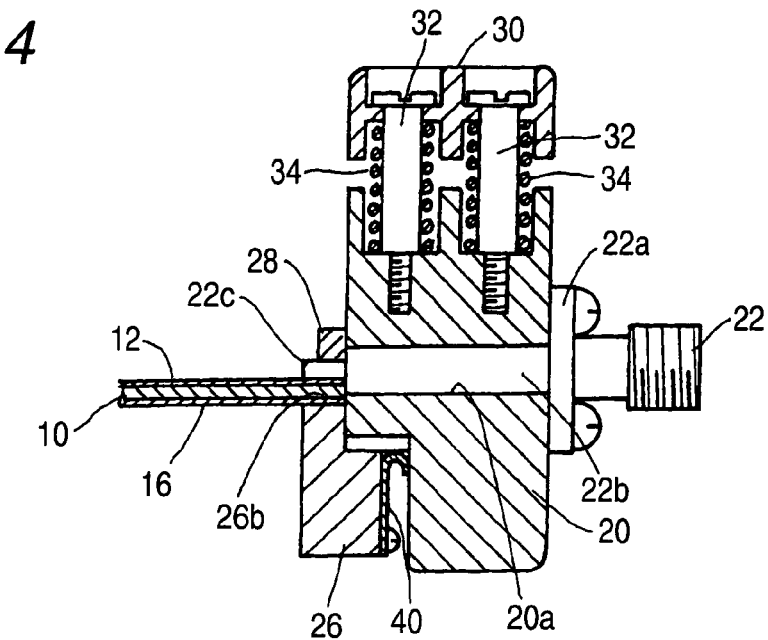
FIG. 4 is a longitudinal sectional view of a state where a board is sandwiched by relay connectors of FIG. 1.

In the relay connector according to the first embodiment having the configuration described above, when the operating member 30 is pressed in the direction approaching the main block 20 against the elastic force of the elastic springs 34, the GND block 26 coupled therewith by the coupling members 38 moves relatively to the main block 20 so that the board receiving portion 26b is moved in the direction of being separated from the core conductor 22c, and so the gap between the board receiving portion 26b and the core conductor 22c is extended. A board 10 aligned is inserted between the core conductor 22c and the board receiving portion 26b. If pressing of the operating member 30 is released, the operating member 30 is moved in the direction of being separated from the main block 20 by the elastic force of the elastic springs 34. Then, the board receiving portion 26b moves in the direction of approaching the core conductor 22c. Thus, as shown in FIG. 4, the board 10 can be sandwiched between the core conductor 22c and the board receiving portion 26b. In this case, if the board 10 is inserted so that the terminal electrode 12 provided at the surface end faces the tip of the core conductor 22c projecting from the insulating cover 28, the board 10 can be easily aligned with the core conductor 22c. If the board 10 is sandwiched in this way, the terminal electrode 12 comes in contact with the core conductor 22c to make an electric connection; and the GND electrode 16 at the back surface end of the board 10 is electrically connected to the shell GND 22a through a series connection of the GND block 26 having the board receiving portion 26b, leaf spring 40 and main block 20. Accordingly, the terminal electrode 12 and GND electrode 16 of the board 10 are electrically connected to the coaxial connector 22. In this case, since the insulating cover 28 is arranged, when the board 10 is sandwiched by the core conductor 22c and the board receiving portion 26b, the force acting in the direction bending the core conductor 22c acts on the insulating cover 28 and so the core conductor 22c will not bend. In addition, the insulating cover 28 abuts on the core conductor 22c with a small area and most of the surface area of the core conductor 22c projected from the dielectric member 22b is exposed to air so that changes in the impedance due to the provision of the insulating cover may be small. If the operating member 30 is pressed again in the direction approaching the main block 20 against the elastic force of the elastic springs 34, the gap between the core conductor 22c and the board receiving portion 26b is extended so that the board 10 can be easily removed. In addition, in the relay connector according to the first embodiment, since its lateral width W is set to be equal to that of the coaxial connector 22, a plurality of the relay connector can be arranged on the board 10 with a high density as in the case where a plurality of single coaxial connector 22 is arranged in a row.

Now referring to FIGS. 5 to 8, the second embodiment of the invention will be explained below. In FIGS. 5 to 8, in order to avoid repetitive explanation, like or equivalent members refer to like reference symbols in FIGS. 1 to 4 and FIGS. 25 and 26.

Figure 1B:
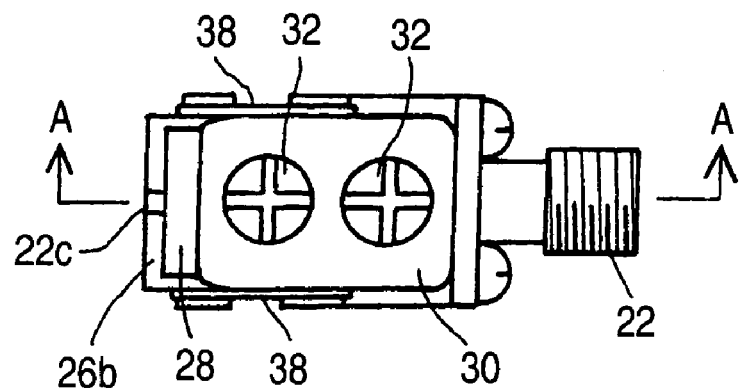
FIGS. 1A to 1C are appearance views of a first embodiment of a relay connector according to the invention.
Figure 1C:
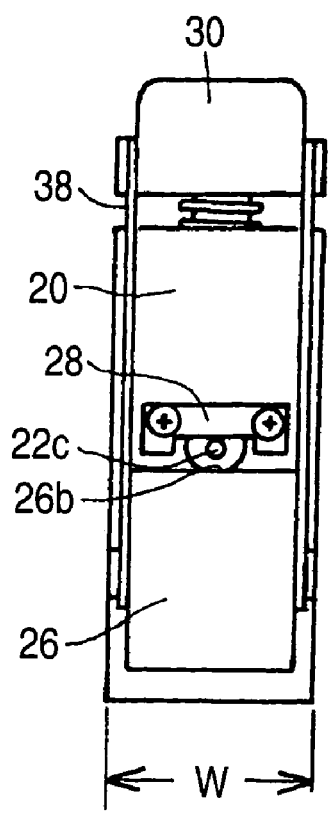
Figure 1A:
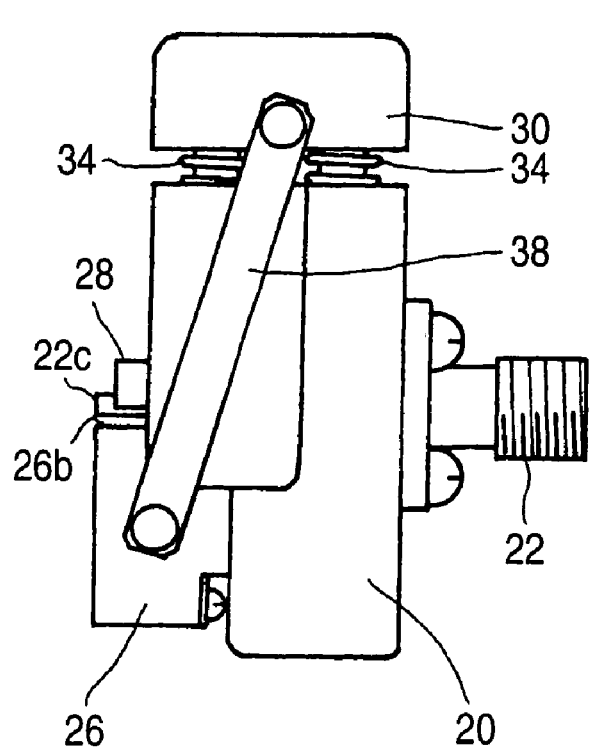
Figure 2:
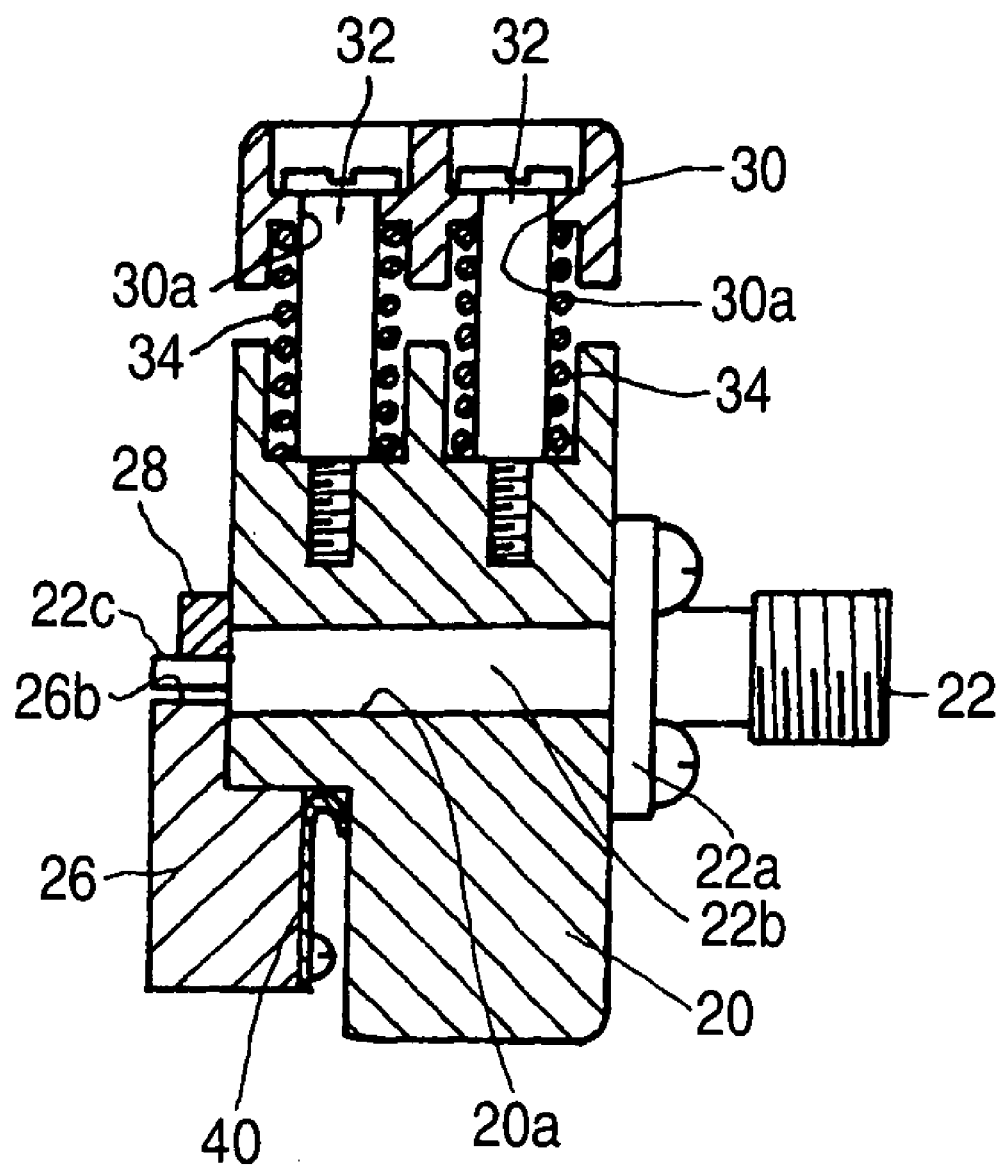
FIG. 2 is a sectional view taken in A-A arrow in FIG. 1.
Figure 3:
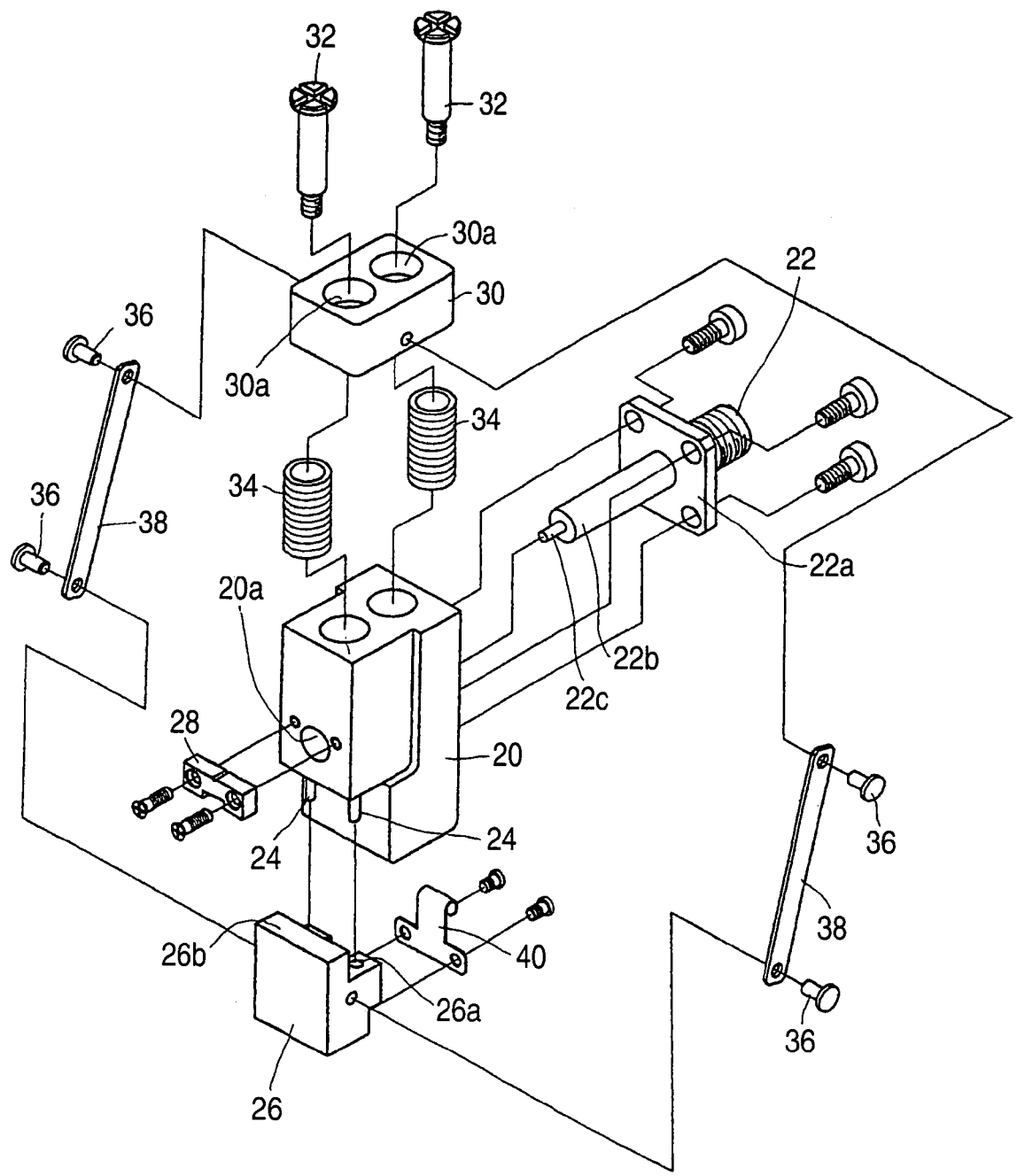
FIG. 3 is an exploded perspective view of FIG. 1.
Figure 5B:
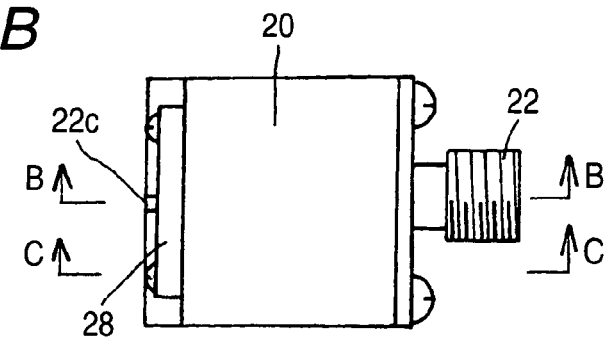
FIGS. 5A to 5C are appearance views of a second embodiment of a relay connector according to the invention.
Figure 5C:
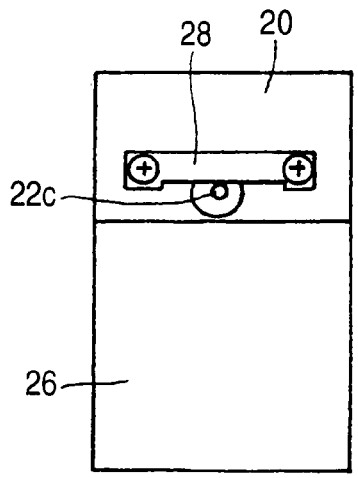
Figure 5A:
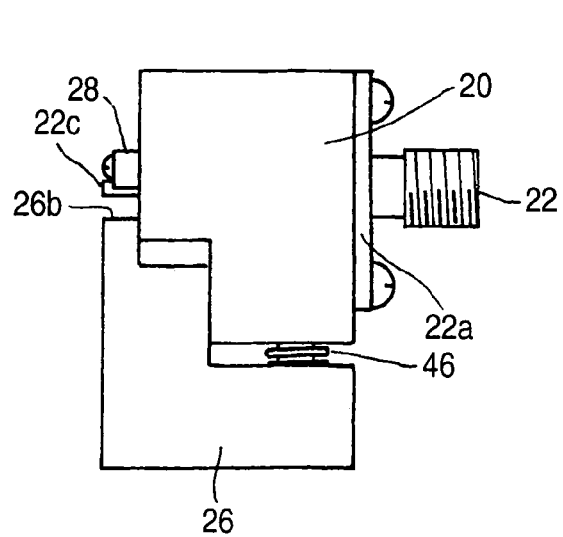
Figure 6:
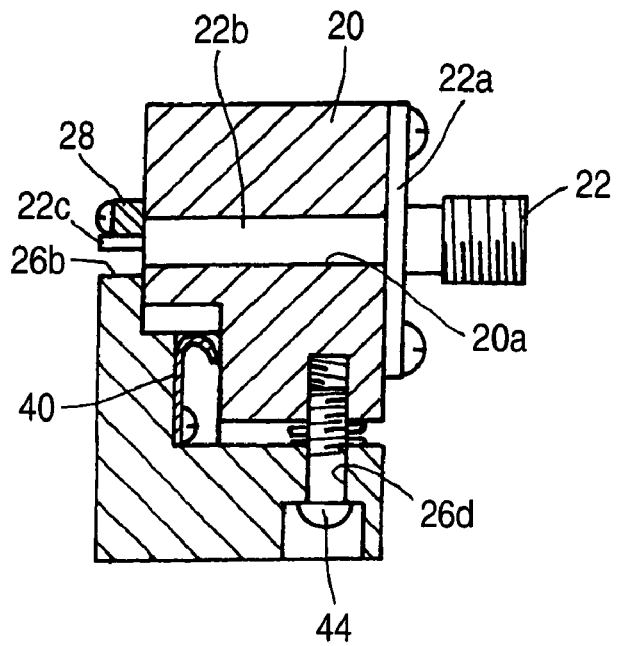
FIG. 6 is a sectional view taken in B-B arrow in FIG. 5.
Figure 7:
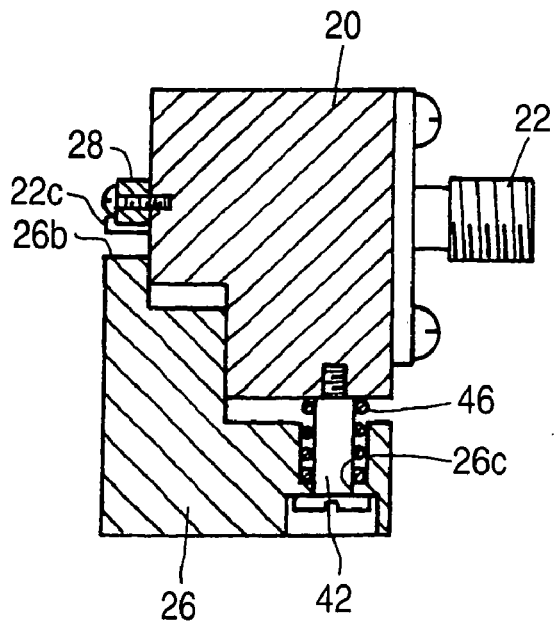
FIG. 7 is a sectional view taken in C-C arrow in FIG. 5.
Figure 8:
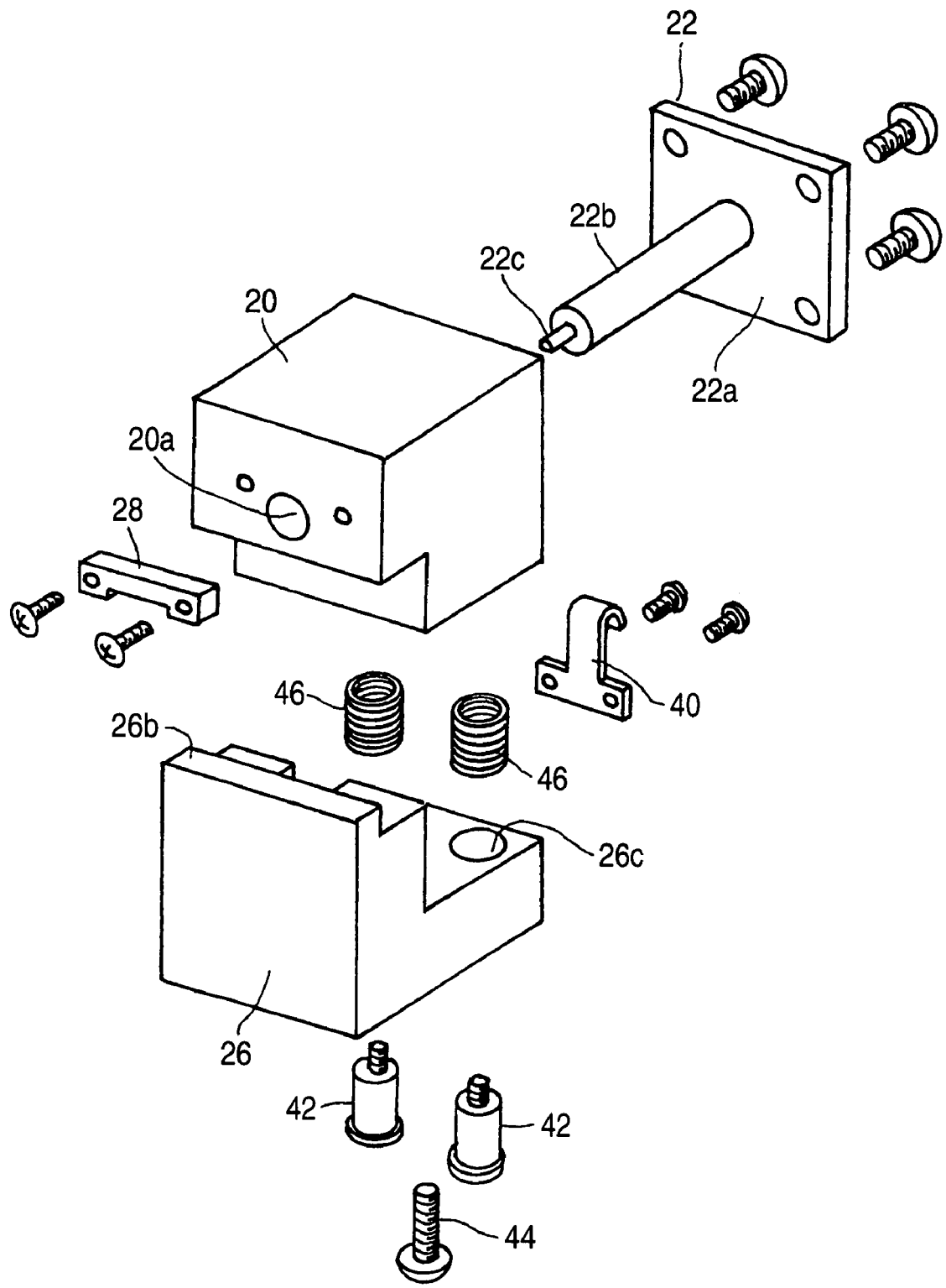
FIG. 8 is an exploded perspective view of FIG. 5.
Figure 9B:
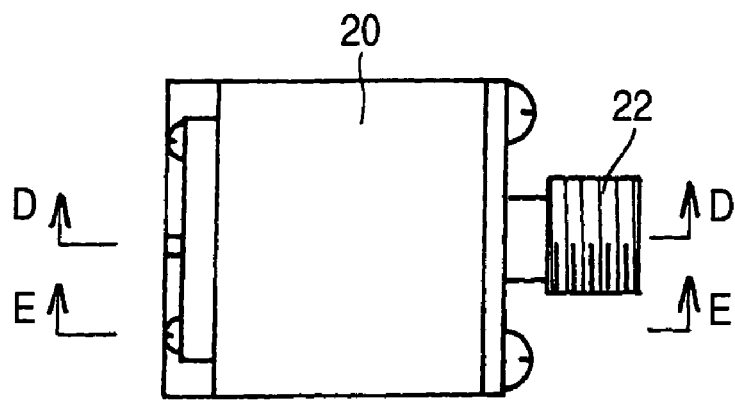
FIGS. 9A to 9C are appearance views of a third embodiment of a relay connector according to the invention.
Figure 9C:
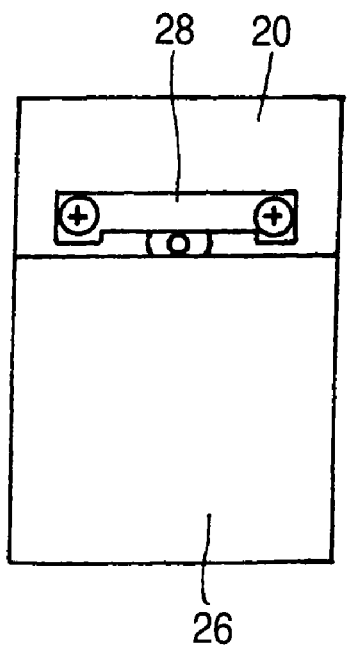
Figure 9A:
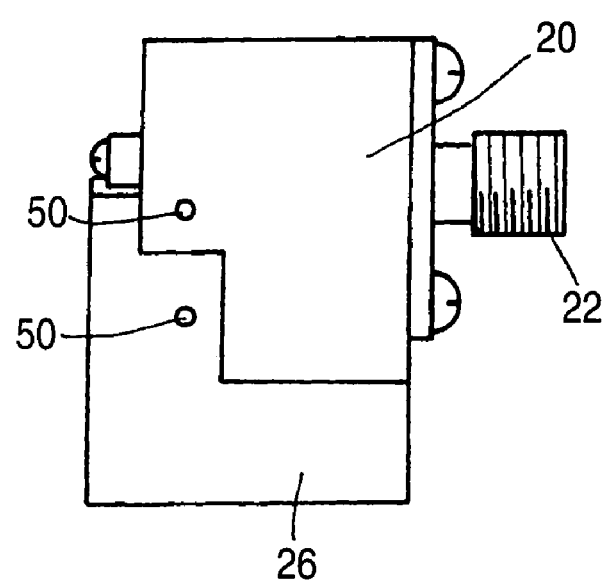
Figure 10:
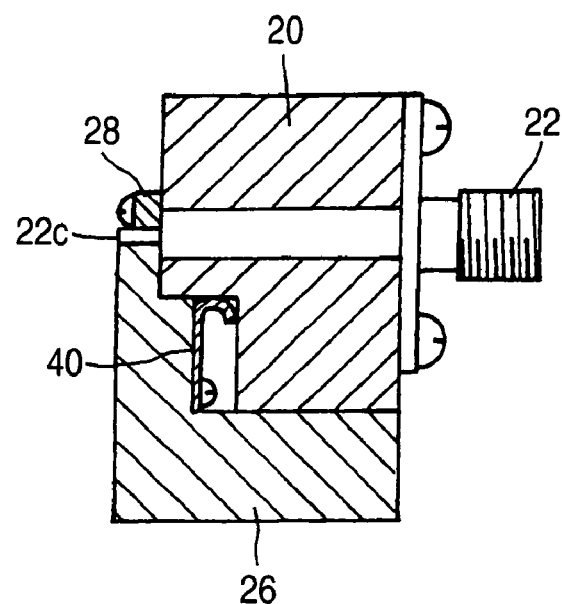
FIG. 10 is a sectional view taken in D-D arrow in FIG. 9.
Figure 11:
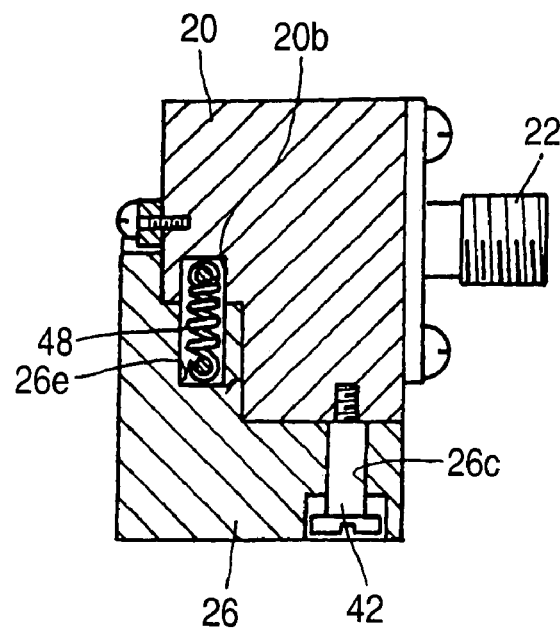
FIG. 11 is a sectional view taken in E-E arrow in FIG. 9.
Figure 12:
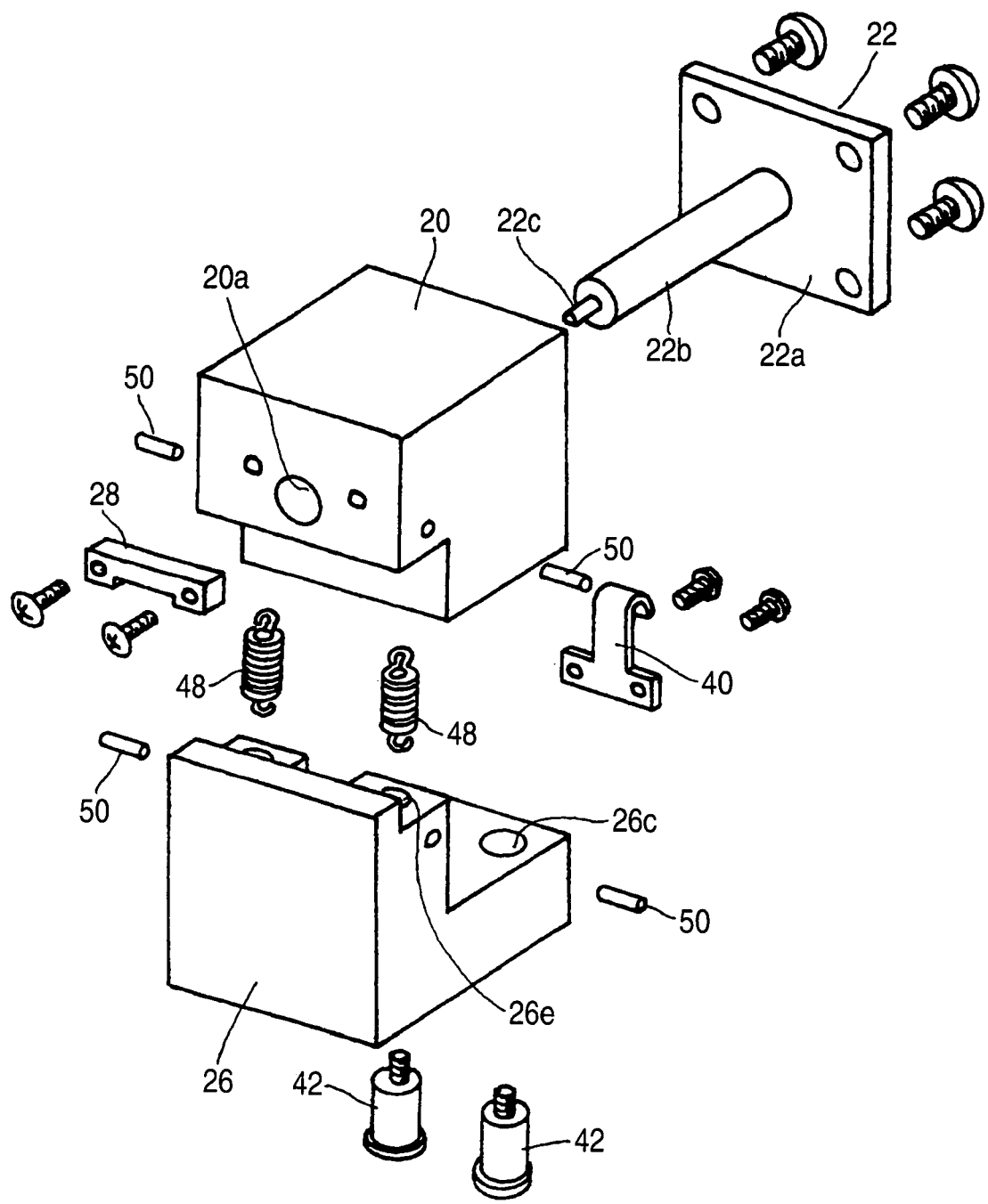
FIG. 12 is an exploded perspective view of FIG. 9.
Figure 13B:
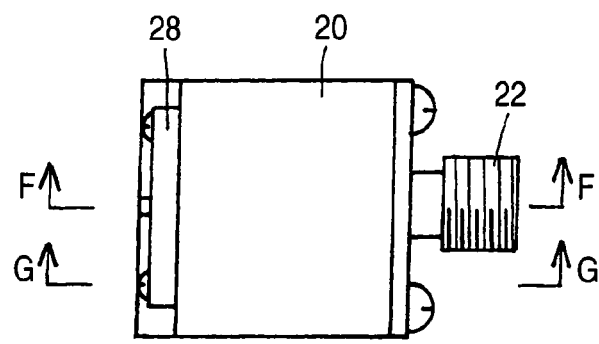
FIGS. 13A to 13D are appearance views of a fourth embodiment of a relay connector according to the invention.
Figure 13C:
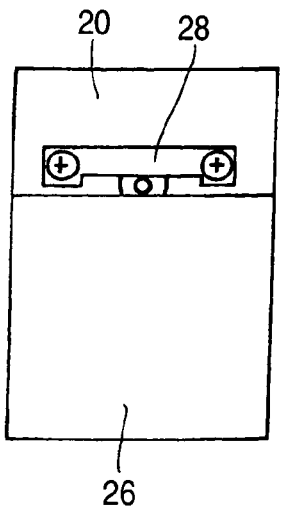
Figure 13A:
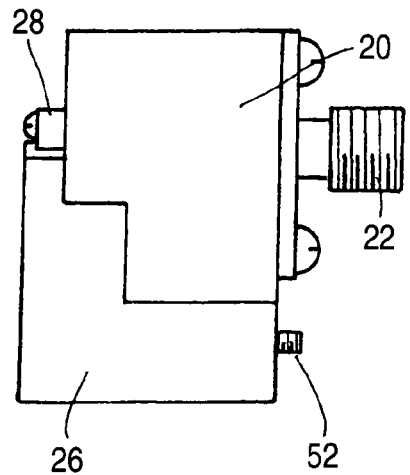
Figure 13D:
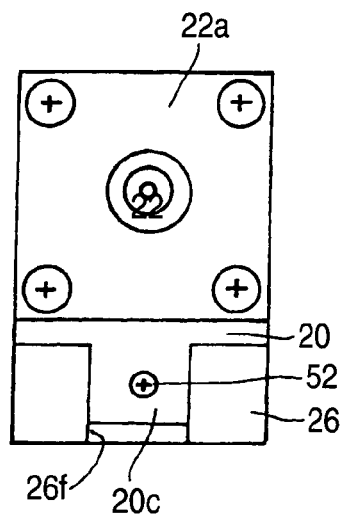
Figure 14:
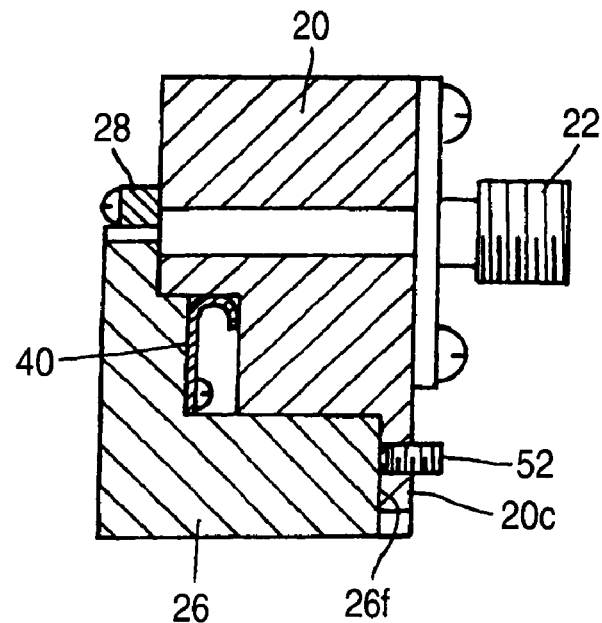
FIG. 14 is a sectional view taken in F-F arrow in FIG. 13.
Figure 15:
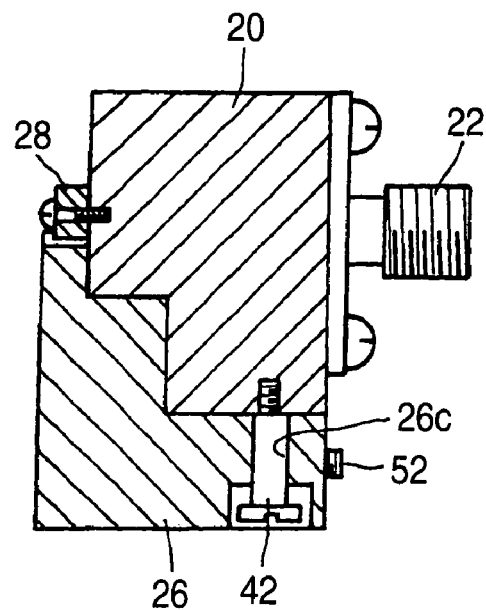
FIG. 15 is a sectional view taken in G-G arrow in FIG. 13.
Figure 16:
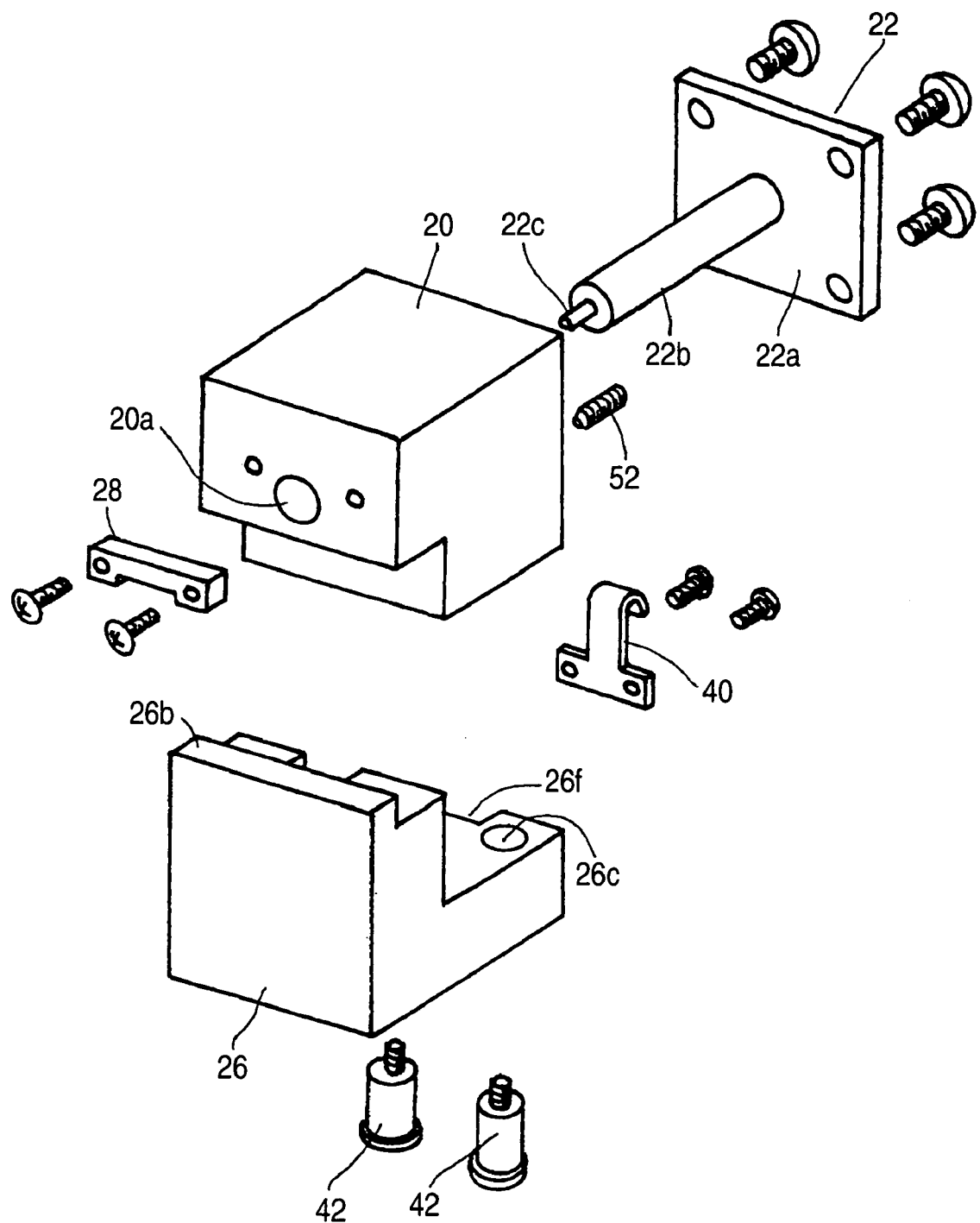
FIG. 16 is an exploded perspective view of FIG. 13.

Referring to FIGS. 5 to 3, in the second embodiment of the relay connector according to the invention, a through-hole 20a is made in a main block 20 of a conductive material; a dielectric member 22b projected from a shell GND 22a of a coaxial connector 22 is inserted into the through-hole 20a from the back surface; the shell GND 22a is fixed to the back surface by a screw; and a core conductor 22c peeled from the dielectric member 22b on the front surface of the main block 20 is projected. Those are the same as in the first embodiment. Also, the insulating cover 28 is in contact with the core conductor 22c and is fixed to the front surface of the main block 20 by the screw. Such arrangement is the same as in the first embodiment. Further, the GND block 26 can be moved relatively to the main block 20 in a linear direction in parallel to the front surface of the main block 20. The GND block 26 has a board receiving portion 26b to face the core conductor 22c so that the board receiving portion 26b can move for the core conductor 22c in an approaching/separating direction by relative movement. Such arrangement is also the same as in the first embodiment. Further, a conductive leaf spring 40 secured to the GND block 26 by screws is arranged so that it slidably comes in an elastic contact with the main block 20 which relatively moves in the approaching/separating direction. The lateral width W of the relay connector according to the second embodiment is set to be equal to that of the coaxial connector 22. Such arrangement is the same as in the first embodiment. However, in the second embodiment, the structure of the guide member is different from that in the first embodiment. Specifically, in the GND block 26, guide screw through-holes 26c and a movement adjusting screw through-hole 26d are made in the approaching/separating direction, respectively. Guide screws 42 are screwed on the main block 20 so as to pass through the guide screw through-holes 26c. The movement adjusting screw 44 is screwed on the main block 20 so as to pass through the movement adjusting screw through-hole 26d. Further, compression springs 46 are arranged in a compressed manner between the GND block 26 and the main block 20 so that they are inserted in the guide screw through-holes 26c and also loosely fit over the guide screws 42. These guide screw through-holes 26c, 26c and guide screws 42 constitute the guide member which limits the GND block 26 so that it can be moved for the main block 20 in the approaching/separating direction. The distance by which the GND block 26 can be separated from the main block 20 is limited by the degree of screwing of the movement adjusting screw 44.

In such a configuration, the GND block 26 is in a state separated from the main block 20 by the elastic force of the compressed springs 46, and the gap between the core conductor 22c and board receiving portion 26b is extended. In this state, the board 10 is inserted in the gap extended between the core conductor 22c and board receiving portion 26b. The movement adjusting screw 44 is rotated in a tightening direction so that the main block 20 approaches the GND block 26 against the elastic force of the compression springs 46. Thus, the gap between the core conductor 22c and the board receiving portion 26b is narrowed, thereby sandwiching the board 10. Then, the core conductor 22c of the coaxial connector 22 is electrically connected to the terminal electrode 12 of the board 10 and the GND electrode 16 of the board 10 is electrically connected to the shell GND 22a of the coaxial connector 22 through a series connection of the board receiving portion 26b, leaf spring 40 and main block 20. Accordingly, also in the relay connector according to the second embodiment of the invention, by bringing the main block 20 near to the GND block 26 against the elastic force of the compression springs 46 using the movement adjusting screw 44, the terminal electrode 12 and GND electrode 16 of the board 10 can be easily electrically connected to the coaxial connector 22. By rotating the movement adjusting screw 44 in a loosing direction, the board 10 can be easily removed. Where the state of the board 10 being sandwiched between the core conductor 22c and board receiving portion 26b is kept by tightening the movement adjusting screw 44, this movement adjusting screw 44 serves as the movement limiting unit. In the second embodiment, in place of tightening the movement adjusting screw 44, the main block 20 may be pressed toward the GND block 26 against the elastic force of the compression springs 46 to sandwich the board 10 between the core conductor 22c and the board receiving portion 26b. In this case, by only releasing the pressing, the board 10 can be easily removed.

Now referring to FIGS. 9 to 12, the third embodiment of the invention will be explained below. In FIGS. 9 to 12, in order to avoid repetitive explanations like or equivalent members refer to like reference symbols in FIGS. 1 to 8 and FIGS. 25 and 26.

Referring to FIGS. 9 to 12, in the relay connector according to the third embodiment of the invention, the structure of each of the main block 20, coaxial connector 22, GND block 26, insulating cover 28 and leaf spring 40 is nearly the same as in the second embodiment. However, the third embodiment is different from the second embodiment in the following points. First, in the GND block 26, in the approaching/separating direction, the guide screw through-hole 26c are made but the movement adjusting screw through-hole 26d is not made. The guide screws 42 which pass through the guide screw through-holes 26c from the side opposite to the main block 20 are screwed on the main block 20, but the movement adjusting screw 44 is not provided. These guide screw through-holes 26c and guide screws 42 constitute the guide member which limits the GND block 26 so that it can be linearly moved for the main block 20 in the approaching/separating direction. Further, on the GND block 26 side of the main block 20 and on the main block 20 side of the GND block 26, spring insertion holes 20b and 26e which are opposite to each other are made. Both ends of extension springs 48 are inserted in these holes, respectively. In addition, fall-out of both ends is stopped by stopper pins 50. It should be noted that by the elastic force of the extension springs 48, 48, the GND block 26 and the main block 20 are elastically urged in the direction of approaching each other.

In such a configuration, the main block 20 and the GND block 26 are separated in the separating direction against the elastic force of the extension springs 48 so that the gap between the core conductor 22c and the board receiving portion 26b is extended. The board 10 is inserted into the extended gap between the core conductor 22c and board receiving portion 26b. In this state, if the force in the separating direction is released, the main block 20 and the board receiving portion 26b approach each other owing to the elastic force of the extension springs 48. Thus, the gap between the core conductor 22c and the board receiving portion 26b is narrowed thereby sandwich the board 10 therebetween. Thus, also in the relay connector according to the third embodiment of the invention, by sandwiching the board 10 using the extension springs 48, the terminal electrode 12 and GND electrode 16 of the board 10 can be easily electrically connected to the coaxial connector 22. If the main block 20 and the GND block 26 are separated again in the separating direction against the elastic force of the extension springs 48 so that the gap between the core conductor 22c and the board receiving portion 26b is extended, the board 10 can be easily removed.

Now referring to FIGS. 13 to 16, the fourth embodiment of the invention will be explained below. In FIGS. 13 to 16, in order to avoid repetitive explanation, like or equivalent members refer to like reference symbols in FIGS. 1 to 12 and FIGS. 25 and 26.

Referring to FIGS. 13 to 16, in the relay connector according to the fourth embodiment of the invention, the structure of each of the main block 20, coaxial connector 22, GND block 26, insulating cover 28 and leaf spring 40 is nearly the same as in the third embodiment. The guide screws 42 which pass through the guide screw through-holes 26c made in the GND block 26 are screwed on the main block 20, thereby constituting the guide member. This is nearly the same as in the third embodiment. In the fourth embodiment, the springs corresponding to the elastic springs 34 in the first embodiment, compression springs 46 in the second embodiment and extension springs 48, 48 in the third embodiment are not provided. In the fourth embodiment, in the main block 20, a set screw use tongue 20c in sliding contact with the GND block 26 is provided. In the GND block 26, a concave 26f is provided for slidably receiving the set screw use tongue 20c for its movement in the approaching/separating direction. Further, there is provided, by screwing, a set screw 52 which is screwed on the set screw use tongue 20c in a direction nearly parallel to core conductor 22c thereby to constitute a movement limiting unit for limiting the relative movement. The tip thereof abuts on the bottom of the concave 26f of the GND block 26.

In such a configuration, in the state where the set screw 52 is loosened in the direction of being separated from the GND block 26, the main block 20 and the GND block 26 are appropriately separated in the separating directions thereby extending the gap between the core conductor 22c and the board receiving portion 26b. The board 10 is inserted into the extended gap between the core conductor 22c and board receiving portion 26b. In this state, the main block 20 and the GND block 26 are brought near to each other so that the gap between the core conductor 22c and the board receiving portion 26b is narrowed thereby sandwiching the board 10 therebetween. In this state, screwing of the set screw 52 is tightened in a direction being pushed into the GND block 26, thereby securing the main block 20 and the GND block 26. Thus, also in the relay connector according to the fourth embodiment of the invention, by appropriately setting the set screw 52, the terminal electrode 12 and GND electrode 16 of the board 10 can be easily electrically connected to the coaxial connector 22. If the set screw 52 is loosened and the main block 20 and the GND block 26 are separated again so that the gap between the core conductor 22c and the board receiving portion 26b is extended, the board 10 can be easily removed.

Now referring to FIGS. 17 to 20, the fifth embodiment of the invention will be explained below. In FIGS. 17 to 20, in order to avoid repetitive explanation, like or equivalent members refer to like reference symbols in FIGS. 1 to 16 and FIGS. 25 and 26.

Figure 17B:
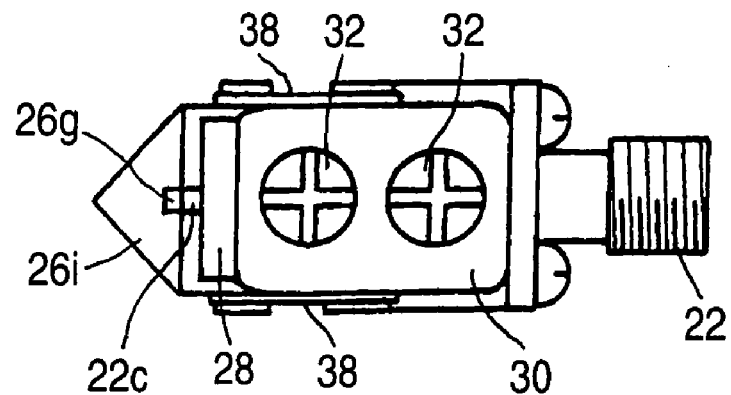
FIGS. 17A to 17C are appearance views of a fifth embodiment of a relay connector according to the invention.
Figure 17C:
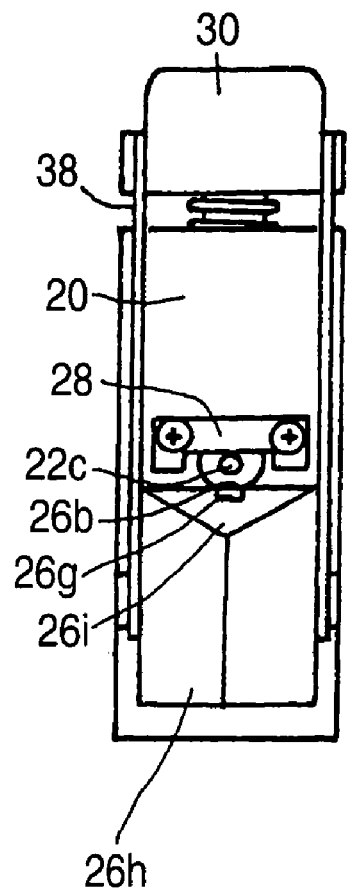
Figure 17A:
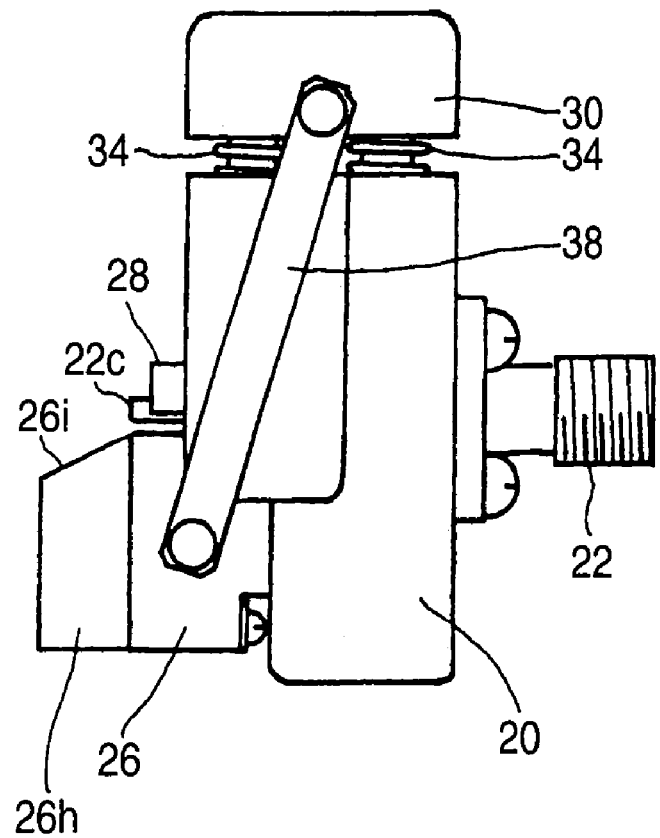

In the relay connector according to the fifth embodiment of the invention shown in FIG. 17, in the board receiving portion 26b of the GND block 26, a groove 26g opposite to the core conductor 22c, having a width nearly equal to the outer shape of the core conductor 22c in the projecting direction. Further, in the GND block 26, a guide portion 26h is provided to project toward the side more forward than the projecting tip of the core conductor 22c, from which the board 10 is to be inserted. In this guide portion 26h, a slope 26i is provided so that it continues to the board receiving portion 26b and its side from which the board 10 is to be inserted is receded from the projecting height of the core conductor 22c in the relative movement direction. Further, the guide portion 26h is formed in the shape of an isosceles triangle with an apex angle of 90 degrees when viewed from the core conductor 22c side in the relative movement direction.

Figure 18A:
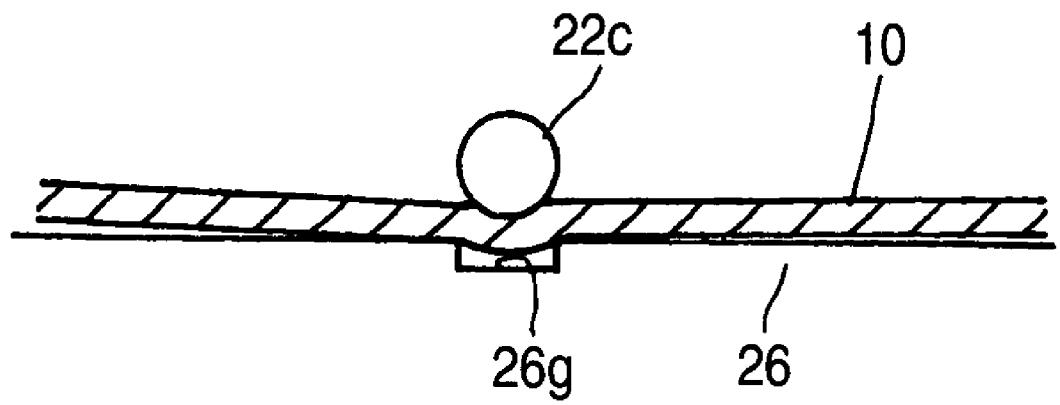
FIGS. 18A and 18B are views showing deformation of the board pressed by the core conductor to be sandwiched.
Figure 18B:
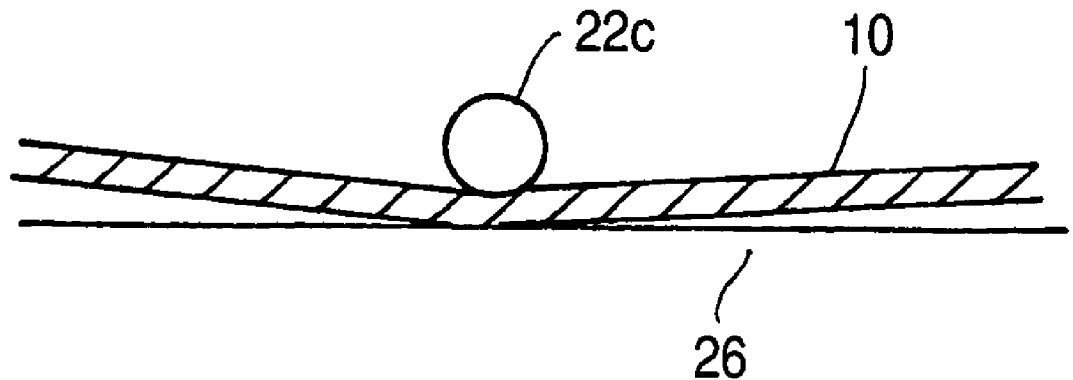
Figure 19A:
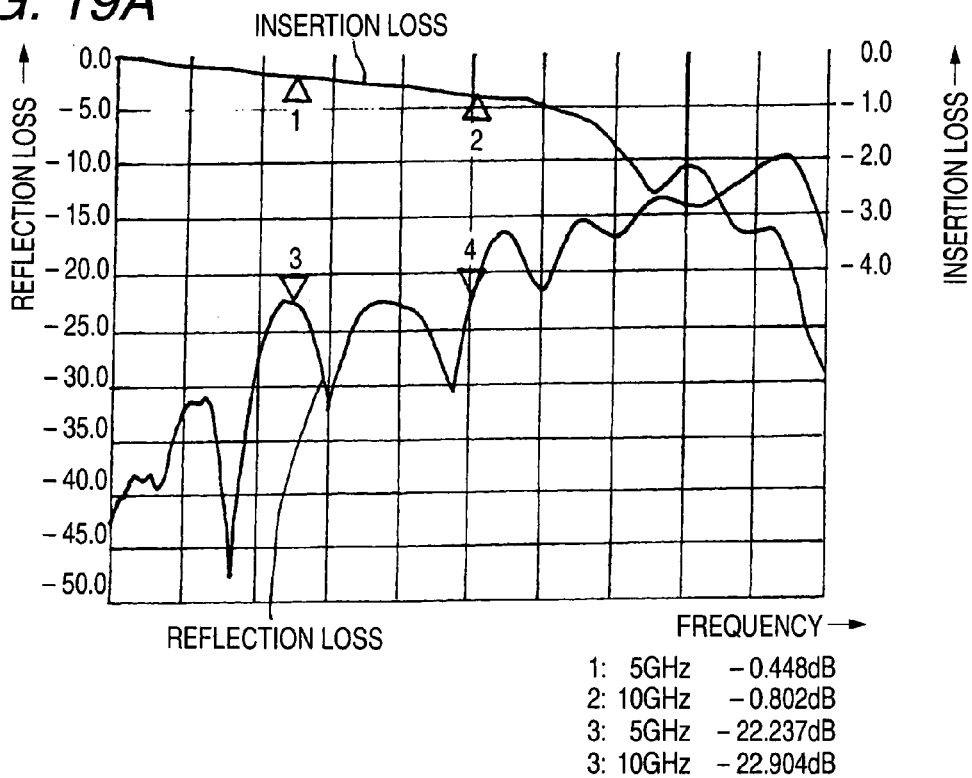
FIGS. 19A and 19B are graphs showing high frequency loss characteristic in a state where the board is pressed by the core conductor to be sandwiched.
Figure 19B:
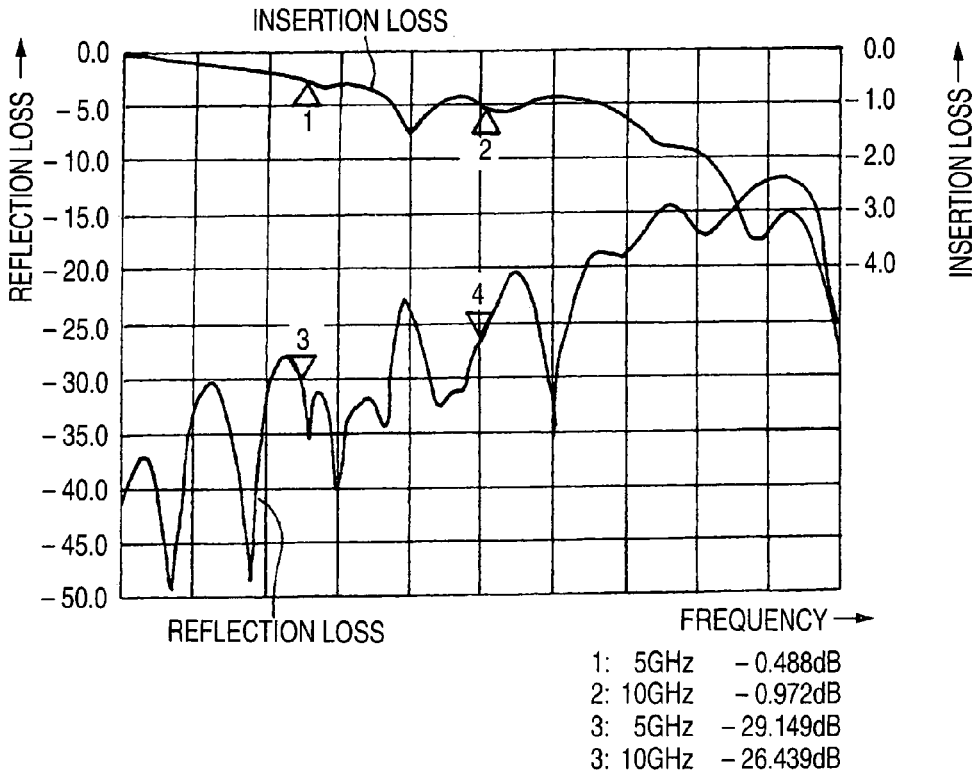

In such a configuration, if the board 10 is inserted on the board receiving portion 26b of the GND block 26 and pressed against the core conductor 22c, as shown in FIG. 18A, the board 10 is slightly deformed so as to enter the groove 26g. Thus, the compression of the board 10 in the thickness direction thereof is relaxed so that the stress acting on the board 10 is dispersed, thereby reducing the deformation of the entire board 10. In addition, the GND electrode 16 of the board 10 is surely brought into contact with the edges on both sides of the groove 26g, thereby surely making an electric connection therebetween. As in the first embodiment, if the groove 26 is not made in the board receiving portion 26b, as shown in FIG. 18B, the board 10 will be largely compressed in the thickness direction thereof so that both sides of the board 10 float. As a result, the GND electrode 16 of the board 10 comes in contact with the GND block 26 in a smaller contact area, thereby not surely making the electric connection. Accordingly, as seen from the high frequency loss characteristic of the fifth embodiment shown in FIG. 19A, as compared with the high frequency loss characteristic of the first embodiment shown in FIG. 19B, the high frequency loss characteristic is improved at the frequency of 5 GHz to 10 GHz.

Figure 20:
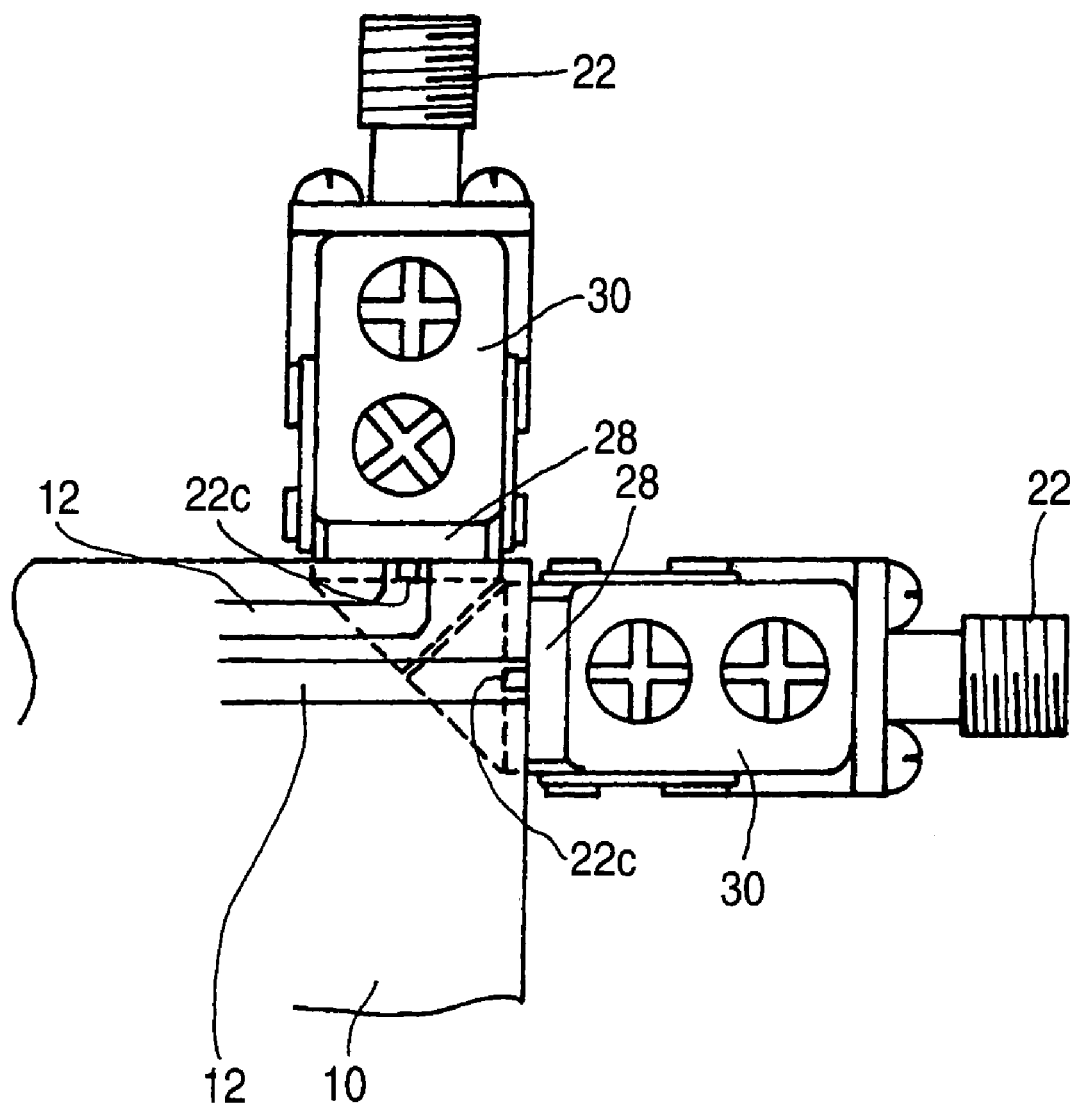
FIG. 20 is a view in which at a corner of the board, two relay connectors according to the fifth embodiment are arranged adjacently to each other at orientations different by 90 degrees.

Further, in the fifth embodiment, since the edge of the board 10 is inserted along the slope 26i of the guide portion 26h projected on the front side from which the board 10 is to be inserted, the board 10 can be easily and surely inserted between the core conductor 22c and the board receiving portion 26b, thereby providing excellent workability. Further, since the guide portion 26h is formed in the shape of an isosceles triangle with an apex angle of 90 degrees when viewed from the core conductor 22c side in the relative movement direction, even when at a corner of the board 10, the two relay connectors according to the fifth embodiment are arranged adjacently to each other at orientations different by 90 degrees, as shown in FIG. 20, they do not hinder each other.

Now referring to FIGS. 21 to 24, the sixth embodiment of the invention will be explained below. In FIGS. 21 to 24, in order to avoid repetitive explanation, like or equivalent members refer to like reference symbols in FIGS. 1 to 20 and FIGS. 25 and 26.

Figure 21:
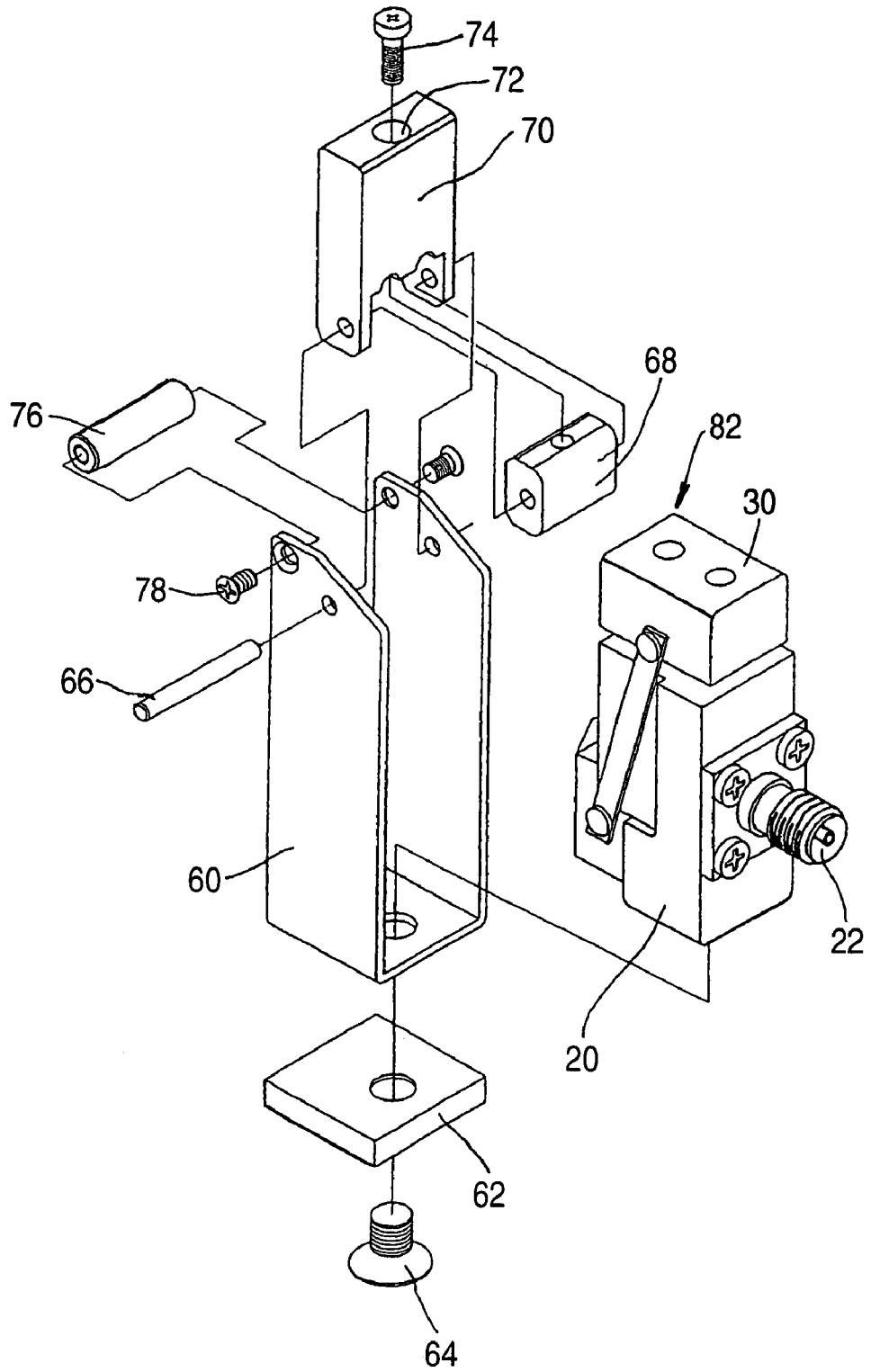
FIG. 21 is an exploded perspective view of a relay connector according to a sixth embodiment of the invention.
Figure 22:
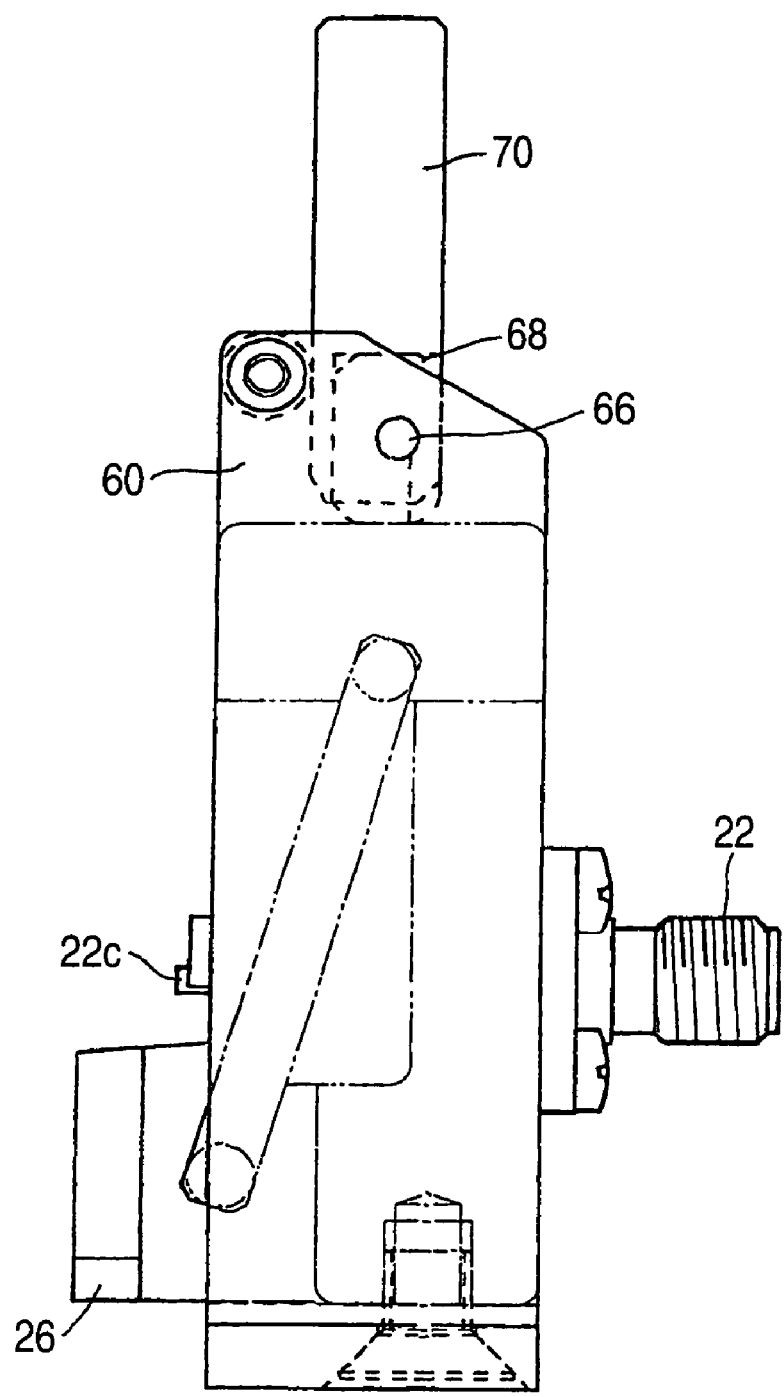
FIG. 22 is a side view of the relay connector according to the sixth embodiment when its holding lever is set at a first swinging position.
Figure 23:
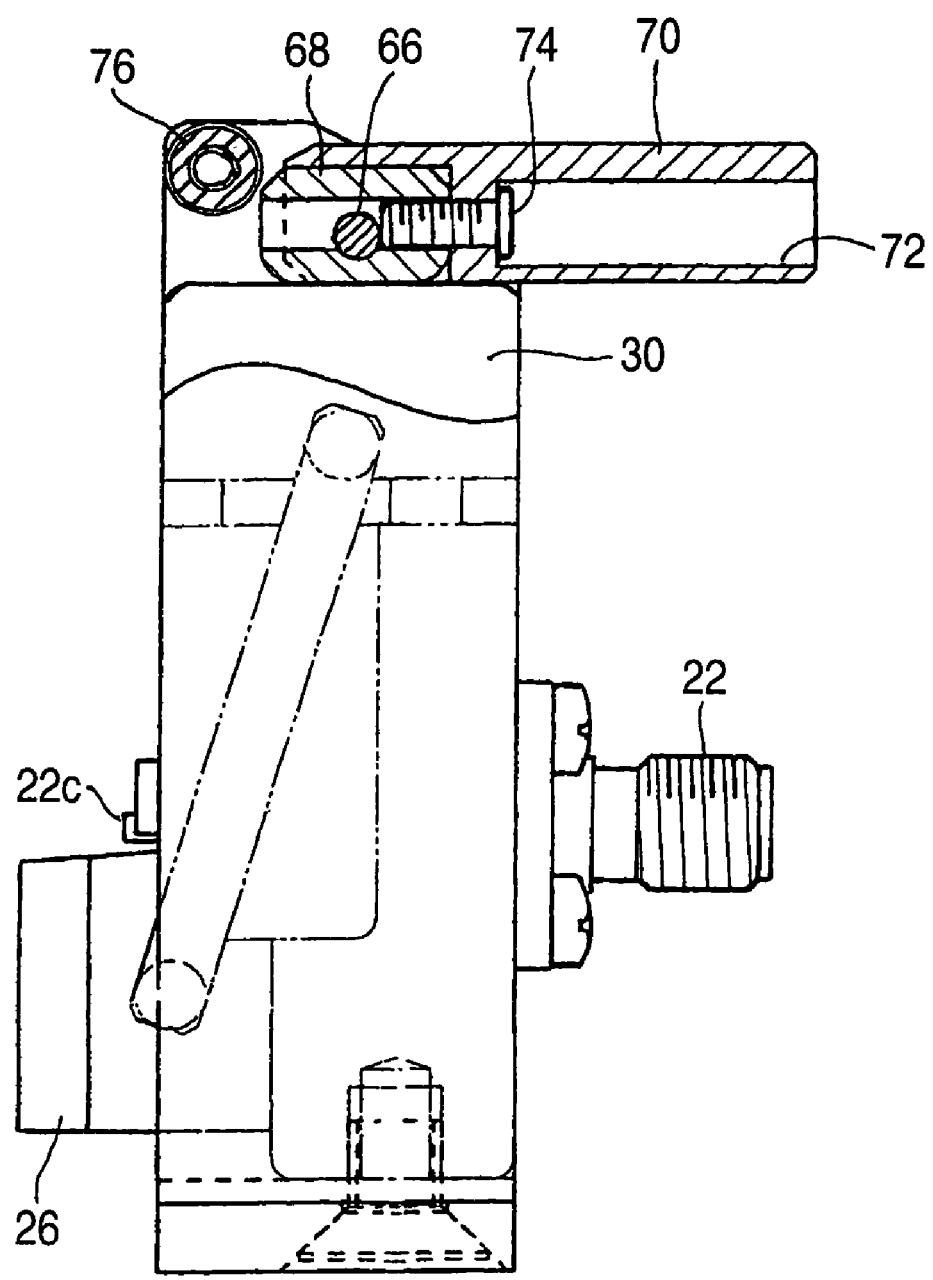
FIG. 23 is a partially-cut side view of the relay connector according to the sixth embodiment when its holding lever is set at a second swinging position.

In the relay connector according to the sixth embodiment of the invention shown in FIGS. 21 to 23, a frame 60 of sheet metal bent in a U-shape is arranged to hold, from blow, the main block 20 of the relay connector 82 according to the first embodiment or the fifth embodiment, and fixed to the main block 20 by a flat countersunk head screw 64 through a spacer 62. The spacer 62 is employed to absorb the thickness of the head of the flat countersunk head screw 64 thereby to make the lower surface thereof flat. The tips of a U-shape arm on both sides of the frame 60 are extended upward to exceed the operating member 30. Above the operating member 30, at the tips of the arm of the frame 60, a swinging supporting shaft 66 orthogonal to the operation moving direction of the operating member 30 is arranged. A holding block 68 is swingably arranged at the swinging supporting shaft 66. A lever 70 is secured to the holding block 68 by a screw 74 inserted into a hole 72. The holding block 68 is nearly rectangular in the section orthogonal to the swinging supporting shaft 66 and its corners are rounded. The swinging supporting shaft 66 passes through the nearly central position of the rectangle. The holding block 68 and the lever 70 constitute the holding lever. At the tips of the arm of the frame 60, a stopper 76 is secured by screws 78. The stopper 76 serves to limit the swinging range of the lever 70 and prevent the tips of the arm of the frame 60 from being extended.

In such a configuration, as shown in FIG. 22, at a first swinging position where the lever 70 is raised, the swing of the lever is stopped by the stopper 76. Further, with the side of the holding block 68 farther from the swinging supporting shaft 66 being kept in contact with the operating member 30, the operating member 30 is moved against the elastic force of the elastic springs 34 thereby to lower the GND block 26. Thus, the board receiving portion 26b and the core conductor 22c are separated from each other, thereby giving the state where the side of the board 10 can be inserted therebetween. On the other hand, as shown in FIG. 23, at a second swinging position where the lever 70 is laid down, with the side of the holding block 68 being nearer to the swinging supporting 66 facing the operating member 30, the operating member 30 is separated from the main block 20 owing to the elastic force of the elastic springs 34 to raise the GND block 26. Thus, the board receiving portion 26b and the core conductor 22c are brought near to each other. Accordingly, the side of the board 10 is sandwiched therebetween so that the terminal electrode 12 provided at the surface end of the board 10 is brought into elastic contact with the core conductor 22c to make an electric connection therebetween.

By changing the lever 70 between the first swinging position and second swinging position, the relay connector 82 can be appropriately set at the state where the board 10 is sandwiched or the state where insertion of the board 10 is permissible. It is needless to say that the shape/dimension of the sectional rectangle in the holding block 68 can be modified to be suitable for insertion and sandwiching of the board 10. In addition, by making the face of the holding block 68 abutting on the operating member 30 flat at the first swinging position where the lever 70 is raised, the structure capable of keeping the first swinging position can be realized. Further, since the holding block 68 and the lever 70 constitute the holding lever, only the holding block 68 which is liable to wear can be exchanged as required, thus facilitating the management and repair. Further, by inserting a narrow rod such as a screwdriver into the hole 72 into which the screw 74 for securing the holding block 68 to the lever 70 is inserted and using this screwdriver as an extension of the lever 70, the lever 70 can be operated by smaller force.

Figure 24:
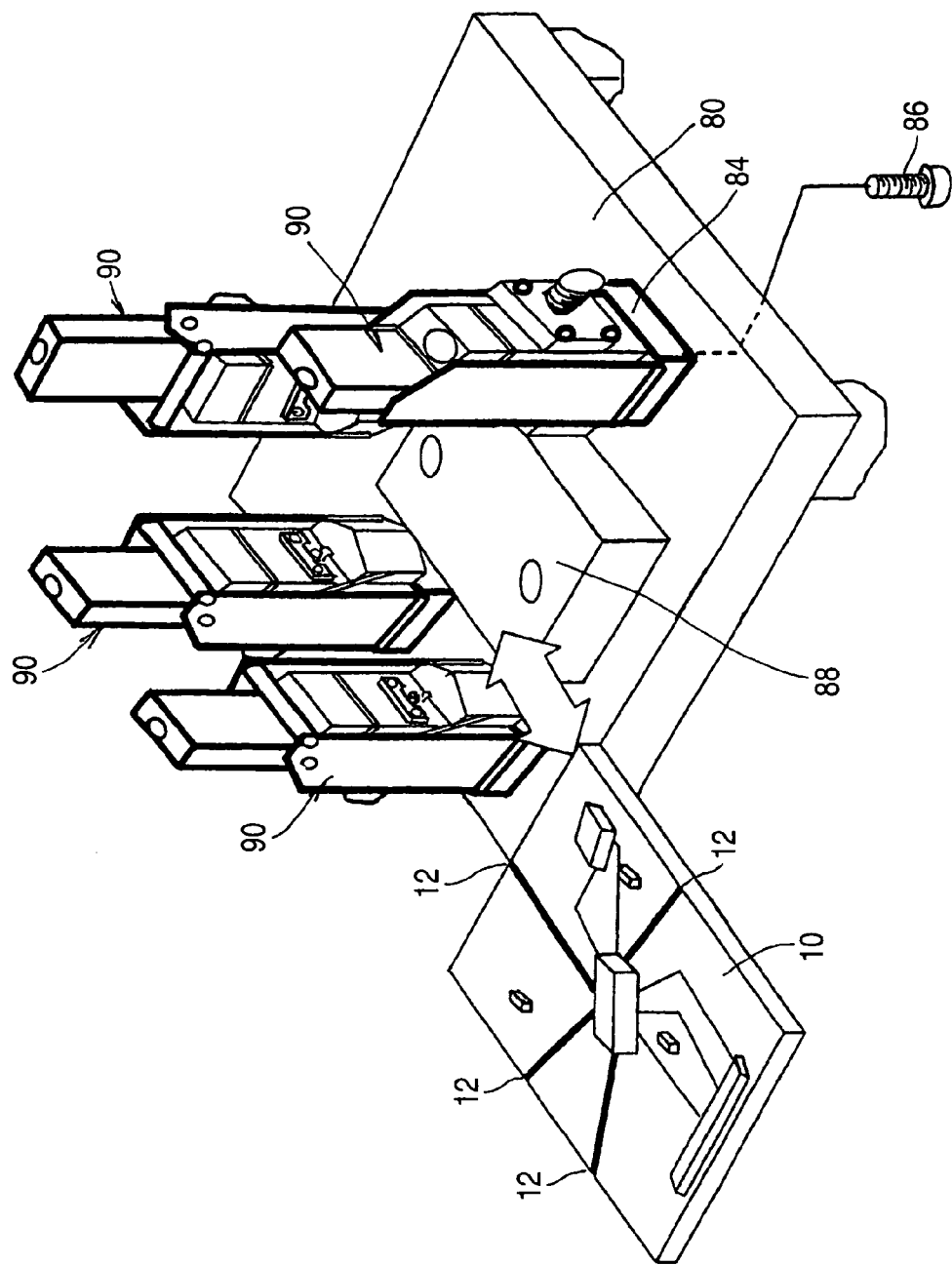
FIG. 24 is a perspective view of an application in which a plurality of relay connectors according to the sixth embodiment of the invention are arranged on a single bed so that they can be electrically connected to a plurality of terminal electrodes provided at surface ends of sides of a single board.

Further, in an application shown in FIG. 24, a plurality of relay connectors 90 each with the holding lever according to the sixth embodiment are fixed to a single bed 80 by fixing screws 86 similar to the screw 64 through spacers 84 respectively. The plurality of relay connectors 90 fixed to the bed 80 are arranged so that the side of a single board 10 can be inserted between the board receiving portions 26b of GND block 26 and the core conductors 22c of the coaxial connectors 22, and the core conductors 22c of the relay connectors 90 face a plurality of terminal electrodes 12 provided at the surface end of the sides of the board 10 inserted. On the bed 80, a provisional stand 88 for guiding the insertion of the board 10 is provided so that the side of the board 10 can be surely guided between the board receiving portions 26b of the GND blocks 26 and the core conductors 22c of the coaxial connectors 22. If the bed 80 is used as a grounding electrode, and the spacers 84 and fixing screws 86 or the frames 60 and spacers 84 are formed of a conductive material, the GND blocks 26 of the relay connectors 82 can be electrically connected to the ground electrode of the single bed 80. Further, the spacers 84 and fixing screws 86 or the frames 60 and the fixing screws 86 are formed of an insulating material, the GND blocks 26 of the relay connectors 82 can be electrically interrupted from the grounding electrode of the bed 80.

In the application having such a configuration, in a state where the levers 70 of all the relay connectors 82 may be located at the first swinging position, the board 10 is inserted, and only the levers 70 of the relay connectors 82 facing the terminal electrodes 12 necessitating the electric connection may be operated to the second swinging position. Since the levers 70 can be kept at either the first swinging position or second swinging position, according to the contents of inspection, the electric connection for all or a part of the terminal electrodes 12 formed on the board 10 can be appropriately done.

In the embodiments described above, the mechanism of limiting the linear movement of the GND block 26 for the main block 20 in the approaching/separating direction should not be limited to those described in the respective embodiments, but may be appropriately formed using e.g. a dovetail groove. The structure for electrically connecting the main block 20 to the GND block 26 with the board receiving portion 26a on which the GND electrode 16 of the board lo is loaded should not be limited to the structure using the leaf springs 40 as in the above embodiments, but may the structure using flexible electric wires. As long as sure conduction can be obtained, any structure can be adopted. Further, in the first to third embodiments, the coil members were employed as the elastic member, but leaf springs may be employed. Further, in the fourth embodiment, in place of the set screw 52, a movement limiting unit having the other structure may be adopted to limit the relative movement of the main block 20 and the GND bock 26.

According to an aspect of the present invention, by the relative movement of the GND block and the main block, the core conductor and the board receiving portion are caused to be separated from each other so that the board can be inserted therebetween and the core conductor and the board receiving portion are caused to approach each other so that the board can be sandwiched therebetween. The core conductor of the coaxial connector is brought into contact with the terminal electrode formed on the front surface of the board to make an electric connection, and the GND electrode formed on the back surface of the board is electrically connected to the shell GND of the coaxial connector from the GND block having the board receiving portion through the main block. Thus, the board can be easily electrically connected to the coaxial connector. Further, by causing the core conductor and board receiving portion to be separated from each other by the relative movement, the board inserted therebetween can be easily moved. In addition, since the insulating cover in contact with the core conductor is arranged on the side opposite to the board receiving portion, when the board is sandwiched between the core conductor and the board receiving portion, the core conductor will not bend.

According to an aspect of the present invention, the main block and the GND block are elastically urged between the core conductor and the board receiving portion in a direction of approaching each other by the elastic member so that the board is sandwiched between the core conductor and the board receiving portion by elastic force of the elastic member. So, by appropriately setting the elastic force, the board can be sandwiched by appropriate constant force. Thus, the contact force is constant so that the electric connection is stabilized.

According to an aspect of the present invention, since the movement limiting unit is provided to limit the relative movement of the main block and the GND block in a state where the board is sandwiched by the core conductor and the board receiving portion, it is not necessary to provide the elastic member for sandwiching the board. Thus, the structure of the relay connector can be simplified.

According to an aspect of the present invention, the leaf spring of a conductive material is secured to the GND block and the leaf spring is brought into an elastic contact with the main block so that the GND block is electrically connected to the main block. Thus, the GND block and main block can be surely electrically connected to each other.

According to an aspect of the present invention, in one of the main block and the GND block, a guide pin is formed upright in the approaching/separating direction and in the other thereof, a guide hole into which the guide pin is inserted is made, thereby constituting the guide member limiting the relative movement so that the approaching/separating direction is a linear direction. Thus, the structure of the relay connector can be simplified.

According to an aspect of the present invention, in one of the main block and the GND block, a guide through-hole is made in the approaching/separating direction, and from the other thereof, a guide screw is passed through the guide through-hole so that its tip is screwed on the one thereof, thereby constituting the guide member limiting the relative movement in the approaching/separating direction. Thus, the structure of the relay connector can be simplified.

According to an aspect of the present invention, when the operating member is pressed and moved toward the main block against the elastic force of the elastic member, the board receiving portion coupled by the operating member and the coupling member moves relatively to the core conductor in the separating direction to extend the gap between the core conductor and the board receiving portion so that the board can be inserted therebetween. By releasing pressing of the operating member, the board can be sandwiched between the core conductor and the board receiving portion by the elastic force.

According to an aspect of the present invention, the elastic member is arranged in a compressed manner between the main block and the GND block to elastically urge the main block and the GND block in the direction of being separated from each other. So, by this elastic force, the board can be easily inserted between the core conductor and board receiving portion with the gap therebetween being extended. By relatively moving the main block and the GND block against the elastic force of the elastic member in the direction approaching each other, the board can be sandwiched between the core conductor and the board receiving portion.

According to an aspect of the present invention, the elastic member is hung between the main block and the GND block to urge the main block and the GND block in the direction of approaching each other. So, by relatively moving the main block and the GND block in the direction of being separated from each other against the elastic force of the elastic member thereby to extend the gap between the core conductor and the board receiving portion, the board can be inserted therebetween. By releasing the force in the separating direction, the board can be sandwiched between the core conductor and the board receiving portion by the elastic force According to an aspect of the present invention, since the tip of the core conductor is projected in an axial direction from the insulating cover, in inserting the board, if the terminal electrode is caused to face the projecting tip of the core conductor, the board can be easily aligned.

According to an aspect of the present invention, since the lateral width of the relay connector is equal to that of the coaxial connector, the relay connectors according to the invention can be arranged in a row with the maximum density in which coaxial connectors can be arranged on the board.

According to an aspect of the present invention, a groove opposite to the core conductor, having a with nearly equal to the outer shape of the core conductor is formed in the board receiving portion of the GND block. So, in a state where the board is pressed against the core conductor and sandwiched, the board is slightly deformed so as enter the groove. Thus, the compression of the board in the thickness direction thereof is relaxed so that the stress acting on the board is dispersed, thereby reducing the deformation of the entire board. In addition, the GND electrode of the board is surely brought into contact with the edges on both sides of the groove to make an electric connection therebetween.

According to an aspect of the present invention, since the edge of the board is inserted along the slope of a guide portion provided to project toward the forward side from which the board is to be inserted, the board can be inserted easily and surely between the core conductor and board receiving portion. Thus, the relay connector provides good operability.

According to an aspect of the present intention, since the guide portion is formed in the shape of an isosceles triangle with an apex angle of 90 degrees when viewed from the core conductor side in the relative movement direction, even when at a corner of the board, the two relay connectors according to the invention are arranged adjacently to each other at orientations different by 90 degrees, they do not hinder each other.

According to an aspect of the present invention, at a first swinging position of the holding lever, the operating member is pressed and moved toward the main block against the elastic force of the operating member to fall in a pressed state, thereby causing the core conductor and board receiving portion to be separated from each other so that the board can be inserted therebetween. At a second swinging position of the holding lever, pressing of the operating member is released so that the operating member falls in a released state to cause the core conductor and board receiving portion to approach each other so that the board can be sandwiched therebetween.

According to an aspect of the present invention, by a plurality of relay connectors according to claim 15 fixed on a single bed, the plurality of connectors can be electrically connected to a plurality of terminal electrodes formed at the surface end of the sides of a single board.

What is claimed is:

1. A relay connector for electrically connecting a core conductor of a coaxial connector to a terminal electrode provided on a front surface end of a board and for electrically connecting a shell GND of the coaxial connector to a GND electrode provided on a back surface end of the board, the relay connector comprising:

a main block, comprised of a conductive material, and formed with a through hole in which a dielectric member of the coaxial connector is inserted, wherein the shell GND of the coaxial connector is secured on a surface of the main block and the core conductor peeled from the dielectric member is projected from an opposite surface of the main block, and a GND block, comprised of a conductive material, and including a board receiving portion on which an end of the board is placed, wherein the GND block can move relatively to the main block, by a guide member, in a linear direction parallel to the surface from which the core conductor is projected, wherein:

by the relative movement of the main block and the GND block, the core conductor and the board receiving portion are caused to approach or be separated from each other so that the board can be inserted and sandwiched therebetween;

an insulating cover in contact with the core conductor is arranged on the surface from which the core conductor is projected on a side opposite to the board receiving portion in an approaching and separating direction; and the main block and the GND block are electrically connected to each other;

wherein the core conductor and the board receiving portion are elastically urged between the main block and the GND block in a direction of approaching each other by an elastic member so that the board is sandwiched between the core conductor and the board receiving portion by elastic force of the elastic member.

2. The relay connector according to claim 1, wherein a movement limiting unit is provided to limit the relative movement of the main block and the GND block in a state where the board is sandwiched between the core conductor and the board receiving portion.

3. The relay connector according to claim 1, wherein a leaf spring comprised of a conductive material is secured to the GND block, and the leaf spring is brought into an elastic contact with the main block sliding in the approaching and separating direction so that the GND block is electrically connected to the main block.

4. The relay connector according to claim 1, wherein the guide member includes a guide pin formed with one of the main block and the GND block and formed upright in the approaching and separating direction, and a guide hole formed with the other of the main block and the GND block and into which the guide pin is inserted.

5. The relay connector according to claim 1, wherein the guide member includes a guide through hole formed with one of the main block and the GND block and extending in the approaching and separating direction, and a guide screw passing through the guide through hole from the other of the main block and the GND block so that a tip portion thereof is screwed on the one of the main block and the GND block.

6. The relay connector according to claim 1, wherein:

an operating member is arranged above the main block on a side opposite to the board receiving portion with respect to the core conductor;

an elastic member is arranged in a compressed manner between the operating member and the main block to elastically urge the operating member in a direction of being separated from the main block;

a coupling member couples the operating member with the GND block;

when the operating member is pressed and moved against elastic force of the elastic member, the board receiving portion moves in a direction of being separated from the core conductor;

the board is inserted in a gap between the core conductor and the board receiving portion extended by pressing the operating member against the elastic force of the elastic member; and by releasing pressing of the operating member, the board is sandwiched between the core conductor and the board receiving portion by the elastic force of the elastic member.

7. The relay connector according to claim 1, wherein an elastic member is arranged in a compressed manner between the main block and the GND block to elastically urge the main block and the GND block in directions of being separated from each other thereby to extend a gap between the core conductor and the board receiving portion by elastic force of the elastic member so that the board can be inserted in the gap; and the main block and the GND block are relatively moved against the elastic force of the elastic member in directions of approaching each other so that the board is sandwiched between the core conductor and the board receiving portion.

8. The relay connector according to claim 1, wherein:

an elastic member is hung between the main block and the GND block to elastically urge the main block and the GND block in directions of approaching each other;

the main block and the GND block are moved in directions of being separated from each other against elastic force of the elastic member thereby to extend a gap between the core conductor and the board receiving portion and the board is inserted in the gap;

force in the directions in which the main block and the GND block are separated from each other is released; and the board is sandwiched between the core conductor and the board receiving portion by the elastic force of the elastic member.

9. The relay connector according to claim 1, wherein a tip portion of the core conductor is projected in an axial direction from the insulating cover.

10. The relay connector according to claim 1, wherein a width of the relay connector is equal to that of the coaxial connector.

11. The relay connector according to claim 1, wherein a groove opposed to the core conductor and having a width nearly equal to an outer shape of the core conductor is formed in the board receiving portion of the GND block.

12. The relay connector according to claim 1, wherein a guide portion is provided at the GND block so as to project toward a side more forward than a projecting tip portion of the core conductor, from which the board is to be inserted, and a slope is provided at the guide portion so as to continue to the board receiving portion, and a side of the slope, from which the board is to be inserted, is receded from a height of the projecting core conductor in a direction of the relative movement.

13. The relay connector according to claim 12, wherein the guide portion is formed in a shape of an isosceles triangle with an apex angle of 90 degrees when viewed from a side of the core conductor in the direction of the relative movement.

14. The relay connector according to claim 6, wherein:
a holding lever is swingably arranged on a side opposite to the main block with respect to the operating member by a frame arranged in the main block;
at a first swinging position of the holding lever, the operating member is pressed and moved toward the main block against the elastic force of the elastic member to fall in a pressed state; and
at a second swinging position of the holding lever, pressing of the operating member is released so that the operating member falls in a released state.

15. The relay connector according to claim 14, wherein a plurality of the relay connectors are fixed to a single bed so that a side of a single board can be inserted between the board receiving portions of the relay connectors and the core conductors of the coaxial connectors, and
the core conductors of the coaxial connectors face a plurality of terminal electrodes provided at a surface end of the side of the board inserted.

16. A relay connector, comprising:
a conductive first block, including: a first surface; a second surface, being opposite to the first surface; and a through hole which communicates the first surface and the second surface and extends in a first direction and into which a coaxial connector is inserted so that a core conductor of the coaxial connector is projected from the first surface and a shell GND of the coaxial connector is secured on the second surface, and
a conductive second block, including a third surface on which a board has both surfaces formed with a first terminal and a second terminal, respectively, wherein
the first block and the second block are electrically connected with each other,
the first block and the second block are moved relatively to each other in a second direction parallel to the first surface and perpendicular to the first direction so that a size of a space between the core conductor projected from the first surface of the first block and the third surface of the second block in the second direction is changed,
the board can be arranged in the space so that the first terminal is brought in contact with the core conductor of the coaxial terminal and the second terminal is brought in contact with the third surface of the second block;
wherein the core conductor and the board receiving portion are elastically urged between the conductive first block and the conductive second block in a direction of approaching each other by an elastic member so that the board is sandwiched between the core conductor and the board receiving portion by elastic force of the elastic member.

* * * * *